United States Patent
Yu et al.

(10) Patent No.: US 10,068,657 B1
(45) Date of Patent: Sep. 4, 2018

(54) DETECTING MISALIGNMENT IN MEMORY ARRAY AND ADJUSTING READ AND VERIFY TIMING PARAMETERS ON SUB-BLOCK AND BLOCK LEVELS

(71) Applicant: SanDisk Technologies LLC, Plano, TX (US)

(72) Inventors: Xuehong Yu, San Jose, CA (US); Liang Pang, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 1 day.

(21) Appl. No.: 15/430,299

(22) Filed: Feb. 10, 2017

(51) Int. Cl.
- *G11C 16/04* (2006.01)
- *G11C 16/34* (2006.01)
- *G11C 16/10* (2006.01)
- *G11C 16/26* (2006.01)

(52) U.S. Cl.
CPC ...... *G11C 16/3431* (2013.01); *G11C 16/0483* (2013.01); *G11C 16/10* (2013.01); *G11C 16/26* (2013.01); *G11C 16/3459* (2013.01)

(58) Field of Classification Search
CPC . G11C 16/0483; G11C 16/3427; G11C 16/08; G11C 16/10; G11C 16/26; G11C 16/3459; G11C 16/3431; G11C 11/5642; G11C 11/5628
USPC ............ 365/185.17, 185.18, 185.28, 185.29, 365/185.02
See application file for complete search history.

(56) References Cited

U.S. PATENT DOCUMENTS

| | | | |
|---|---|---|---|
| 9,009,568 B2 | 4/2015 | Luo et al. | |
| 9,224,502 B1 | 12/2015 | Sabde et al. | |
| 9,236,139 B1 * | 1/2016 | Lai | G11C 16/3427 |
| 9,412,463 B1 * | 8/2016 | Chen | G11C 16/3427 |
| 9,460,805 B1 | 10/2016 | Pang et al. | |
| 9,761,320 B1 * | 9/2017 | Chen | G11C 16/3431 |
| 9,830,963 B1 * | 11/2017 | Pang | G11C 7/04 |
| 2001/0048610 A1 | 12/2001 | Homma et al. | |
| 2009/0154244 A1 | 6/2009 | Shiga | |
| 2010/0131809 A1 | 5/2010 | Katz | |
| 2014/0289559 A1 | 9/2014 | Hashimoto | |
| 2015/0261467 A1 | 9/2015 | Seo et al. | |

OTHER PUBLICATIONS

International Search Report & Written Opinion dated Feb. 2, 2018, International Application No. PCT/US2017/063440.

\* cited by examiner

*Primary Examiner* — Gene Auduong
(74) *Attorney, Agent, or Firm* — Vierra Magen Marcus LLP

(57) ABSTRACT

A memory device and associated techniques adjust voltage ramping times optimally for each block or sub-block of memory cells to account for fabrication variations. The widths of word lines and select gate lines can vary in different sub-blocks due to misalignments in the fabrication process. The resistance and voltage settling times vary based on the widths. In one aspect, a shortest acceptable ramp down period is determined for a select gate line. This period avoids excessive read errors. A corresponding shortest acceptable word line voltage ramping period is then determined for each sub-block. A pattern in the ramp down periods can be detected among the tested sub-blocks or blocks and used to set ramp down periods in other sub-blocks or blocks. The overall time for a programming or read operation is therefore minimized.

20 Claims, 24 Drawing Sheets

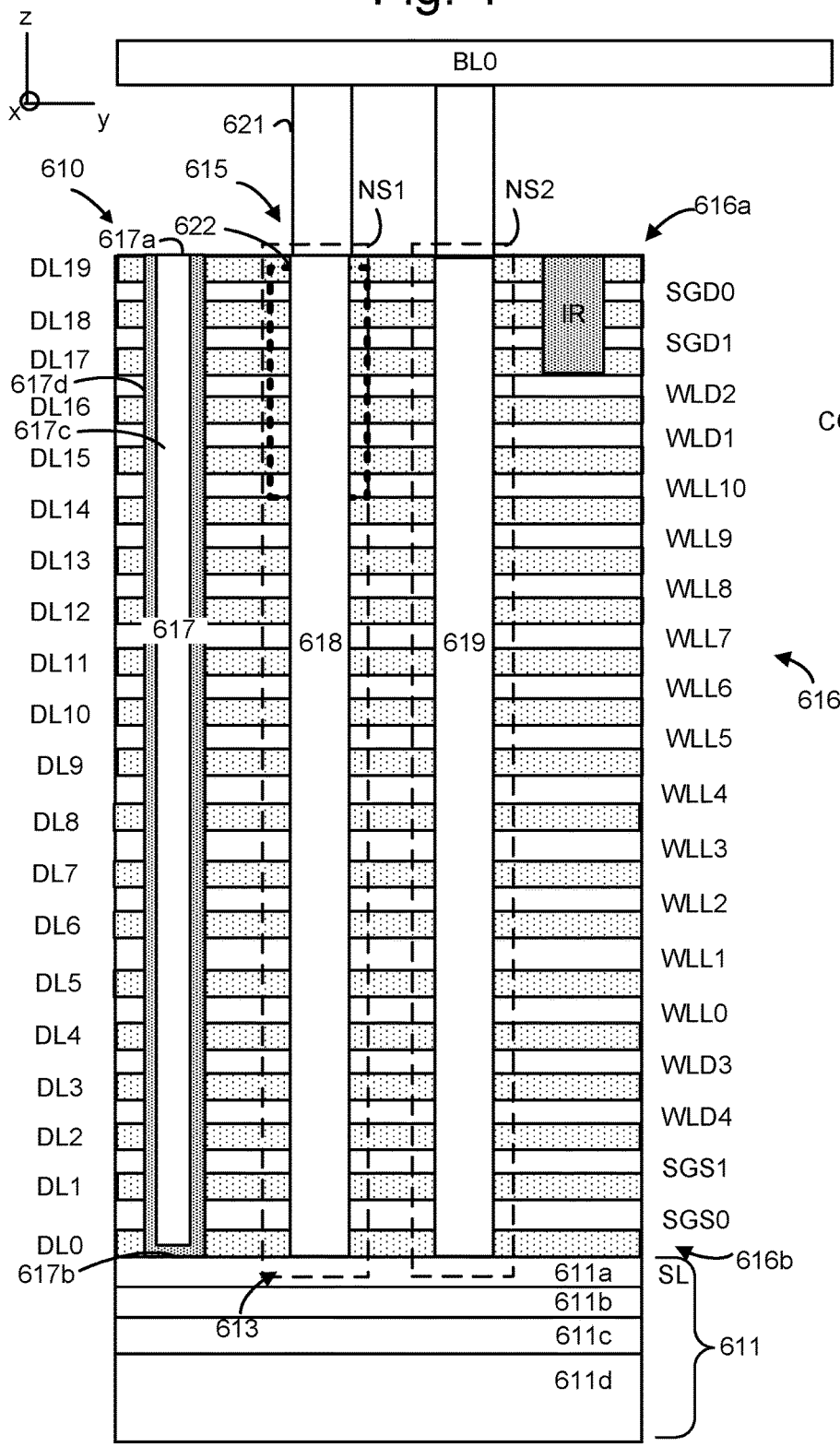

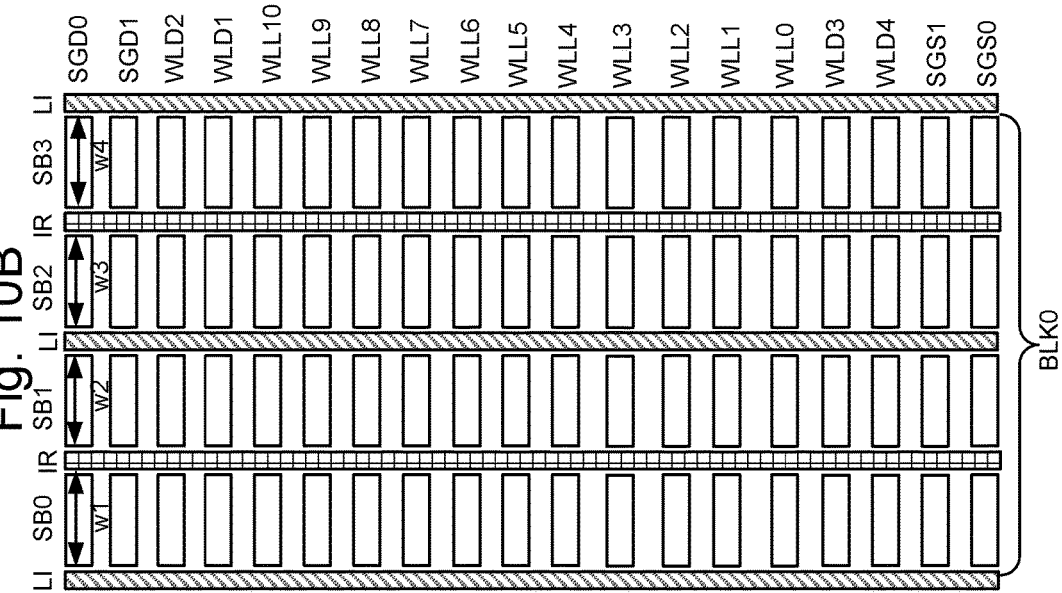
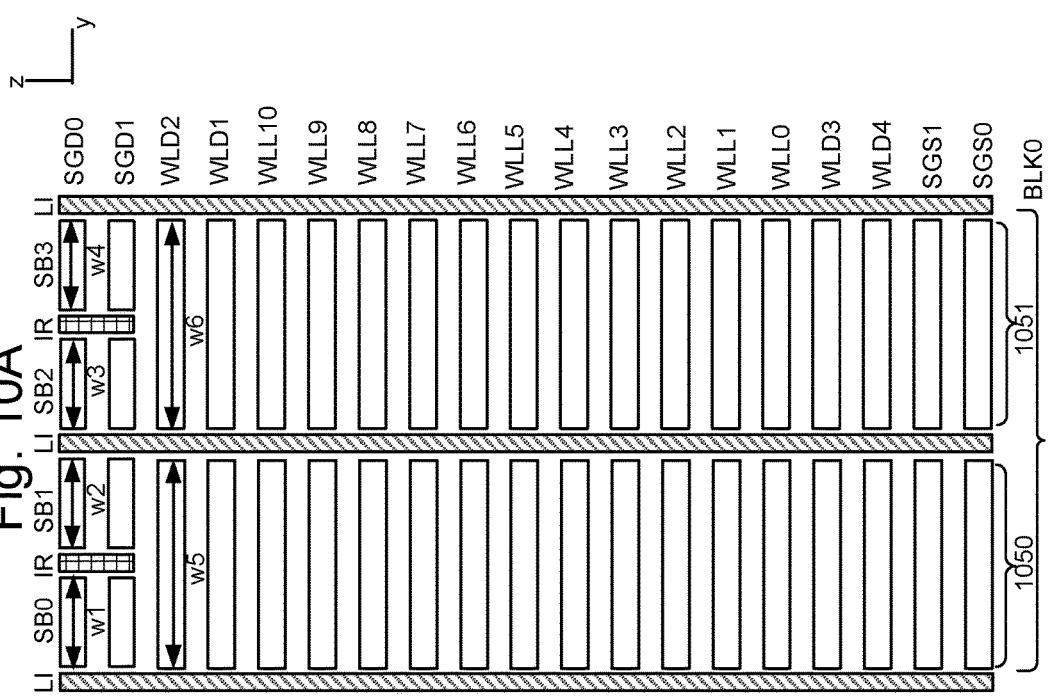

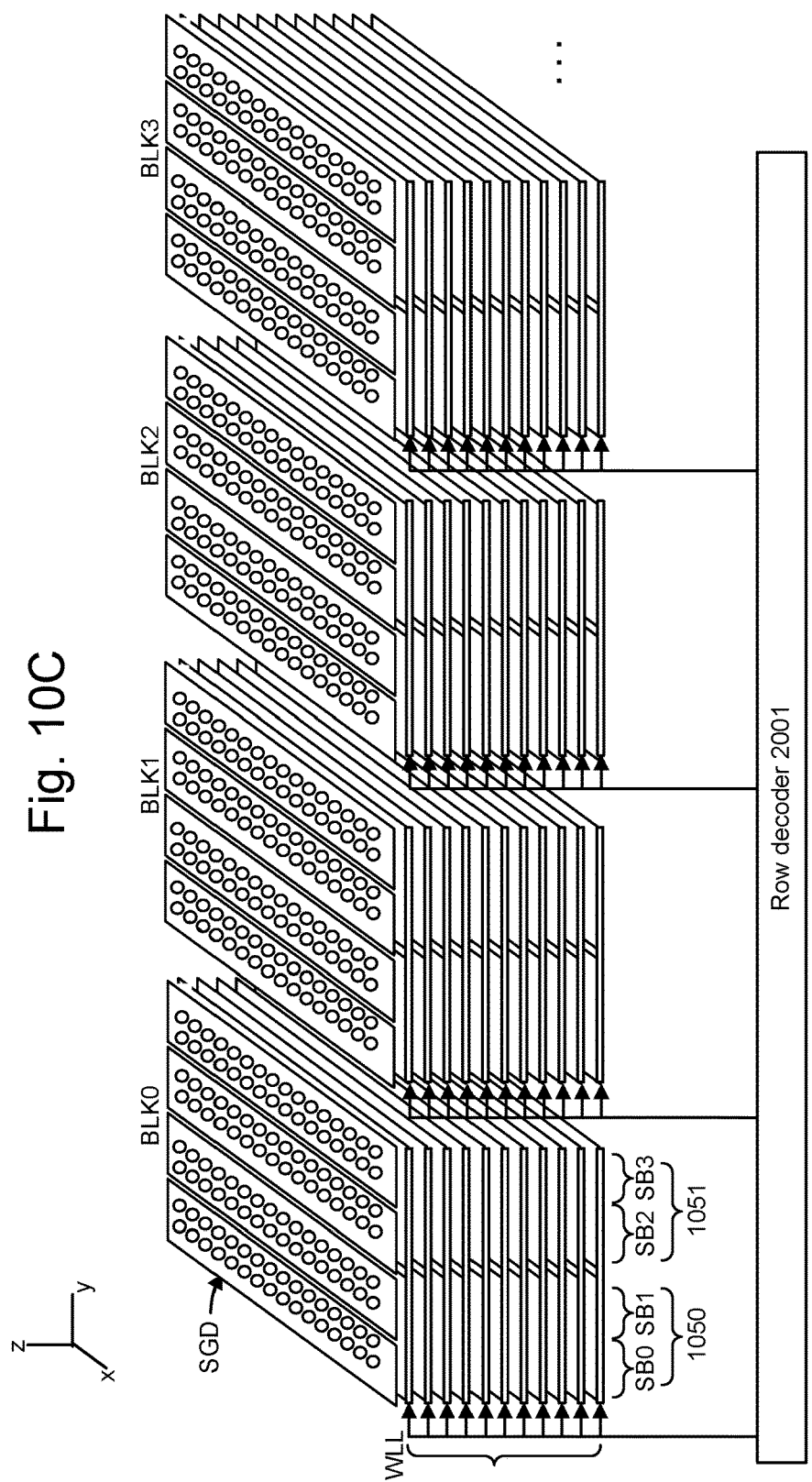

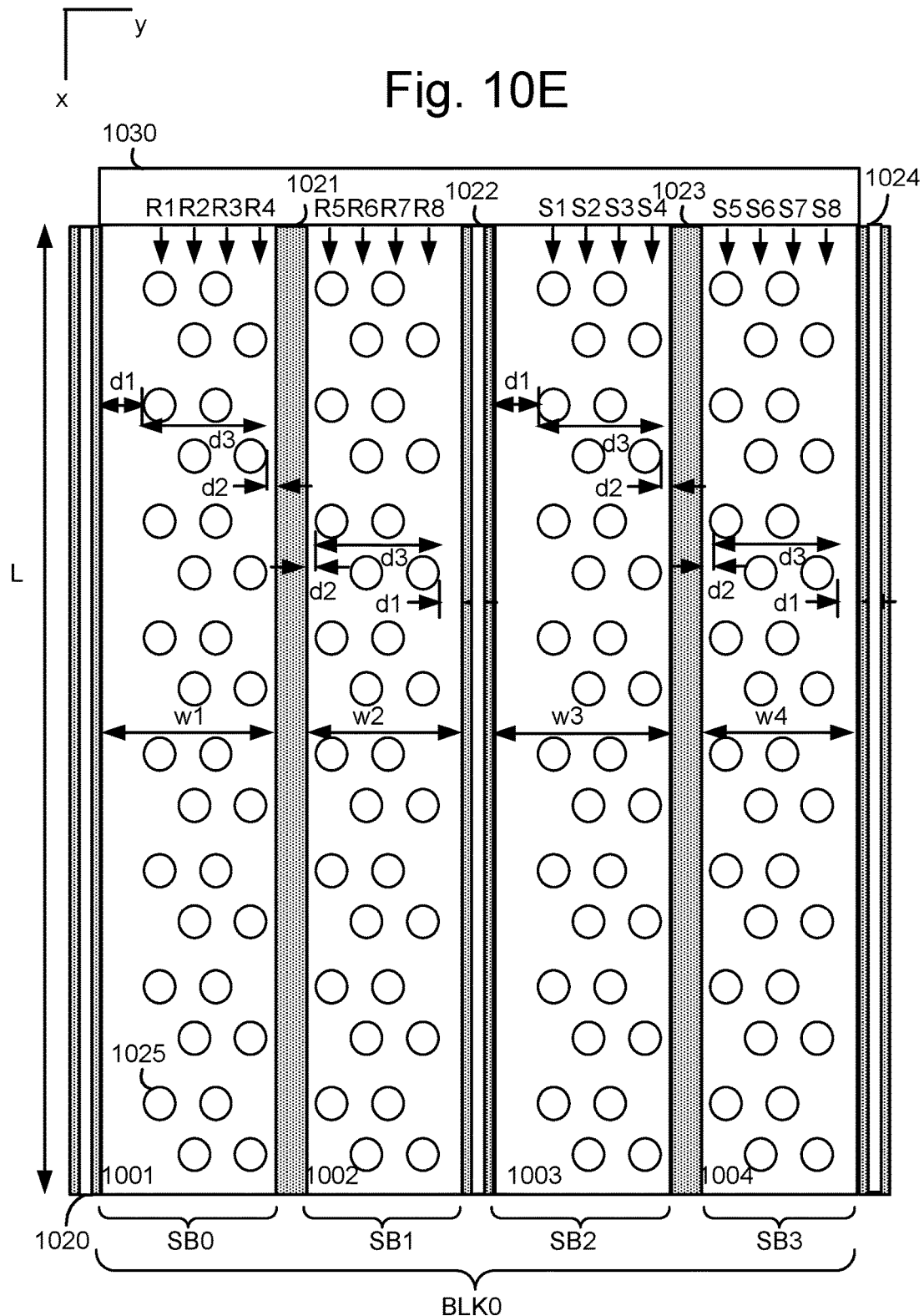

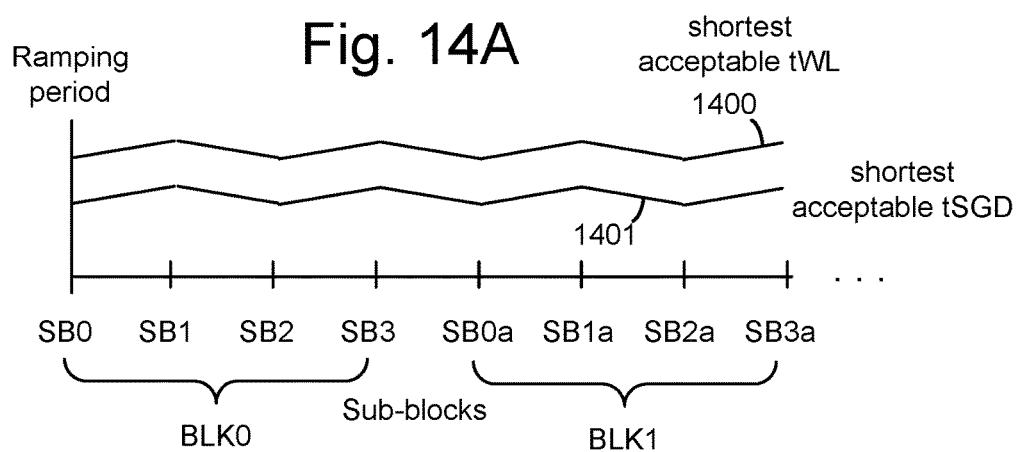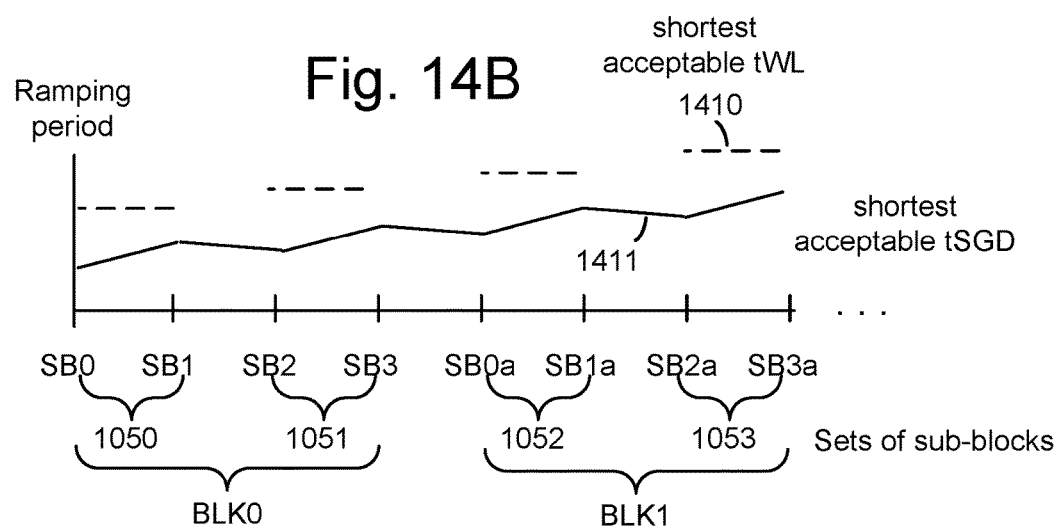

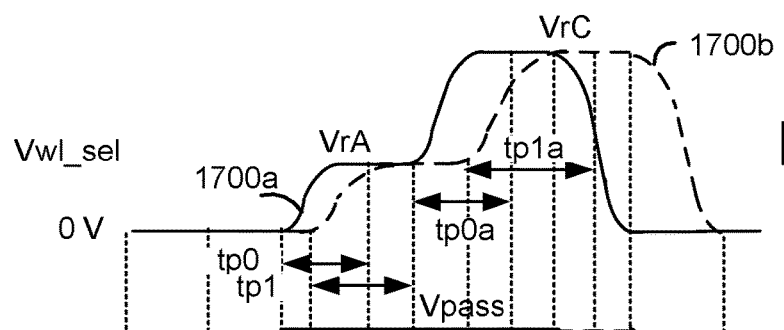
Fig. 17A
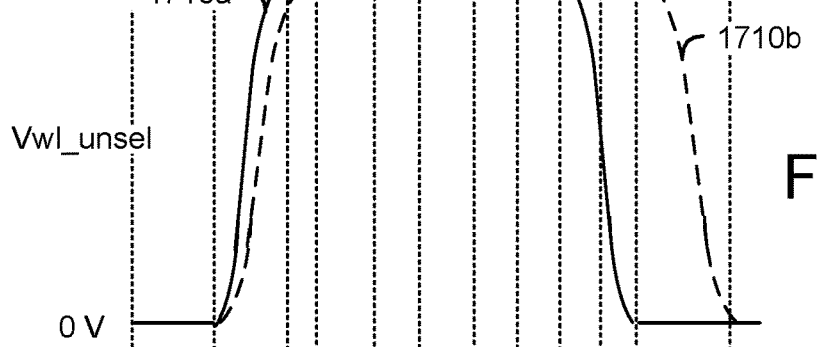
Fig. 17B
Fig. 17C
Fig. 17D
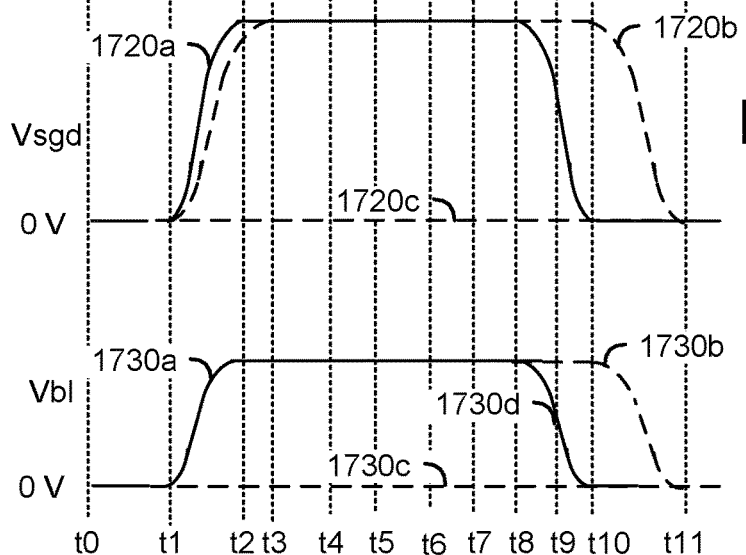

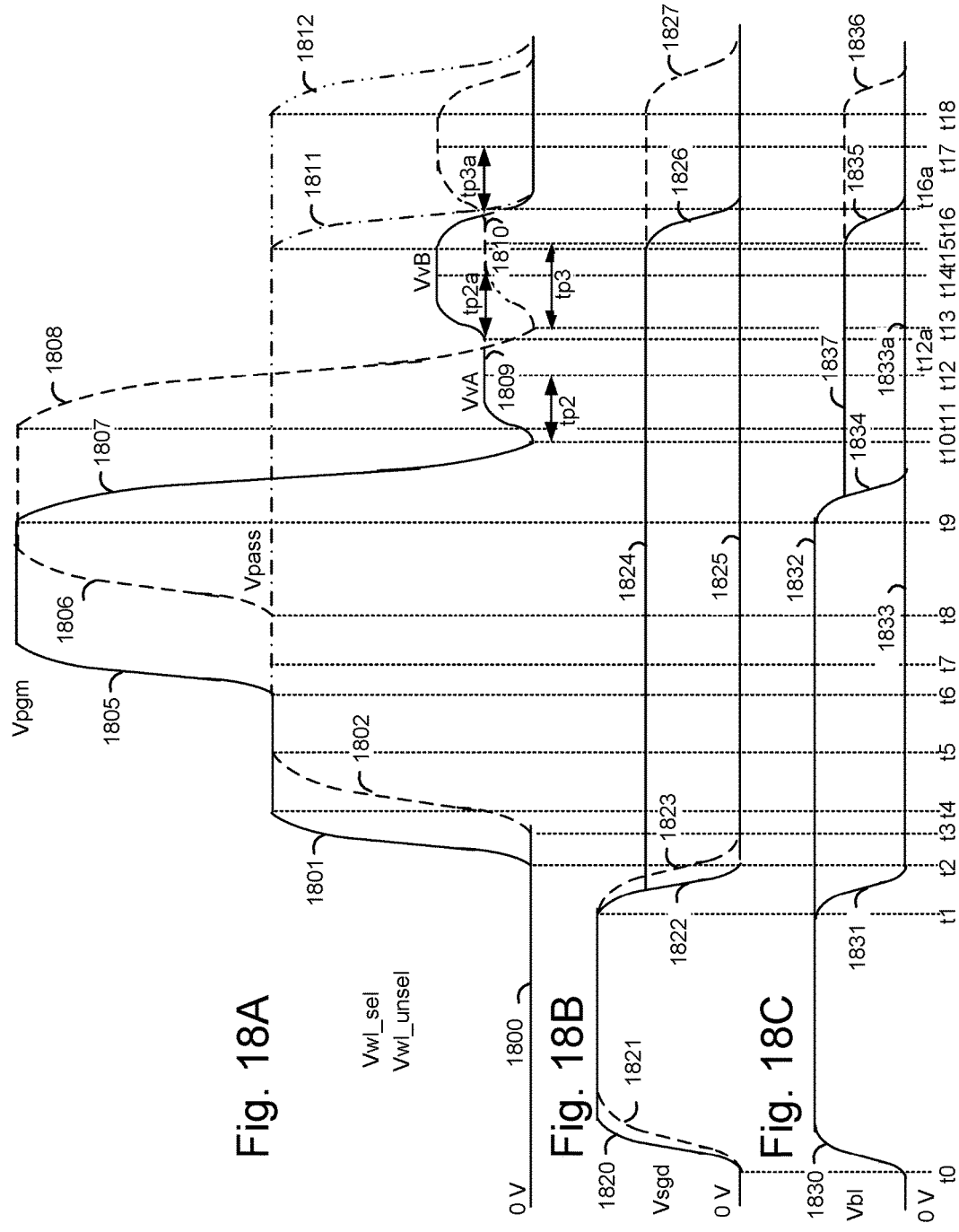

DETECTING MISALIGNMENT IN MEMORY ARRAY AND ADJUSTING READ AND VERIFY TIMING PARAMETERS ON SUB-BLOCK AND BLOCK LEVELS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 500.

FIG. 10A depicts an example cross-sectional view of a block BLK0 of memory cells where word line layers are shared among two sub-blocks.

FIG. 10B depicts an example cross-sectional view of a block BLK0 of memory cells where word line layers are provided for each sub-block.

FIG. 10C depicts a perspective view of a set of blocks consistent with FIG. 10A.

FIG. 10E depicts a cross-sectional view of a block BLK0 of memory cells along a word line layer consistent with the structure of FIGS. 4 and 10B.

FIG. 14A depicts a plot of ramping period versus sub-block for a row of sub-blocks, consistent with FIG. 10E.

FIG. 14B depicts a plot of ramping period versus sets of sub-block for a row of sub-blocks.

FIG. 17A depicts example waveforms of a selected word line in a read operation.

FIG. 17B depicts example waveforms of an unselected word line in a read operation.

FIG. 17C depict example waveforms for SGD transistors in a read operation.

FIG. 17D depicts example waveforms for bit lines connected to selected and unselected memory strings in a read operation.

FIG. 18A depicts example waveforms of selected and unselected word lines in a programming operation.

FIG. 18B depict example waveforms for SGD transistors in a programming operation.

FIG. 18C depicts example waveforms for bit lines connected to selected and unselected memory strings in a programming operation.

DETAILED DESCRIPTION

Figure 1:
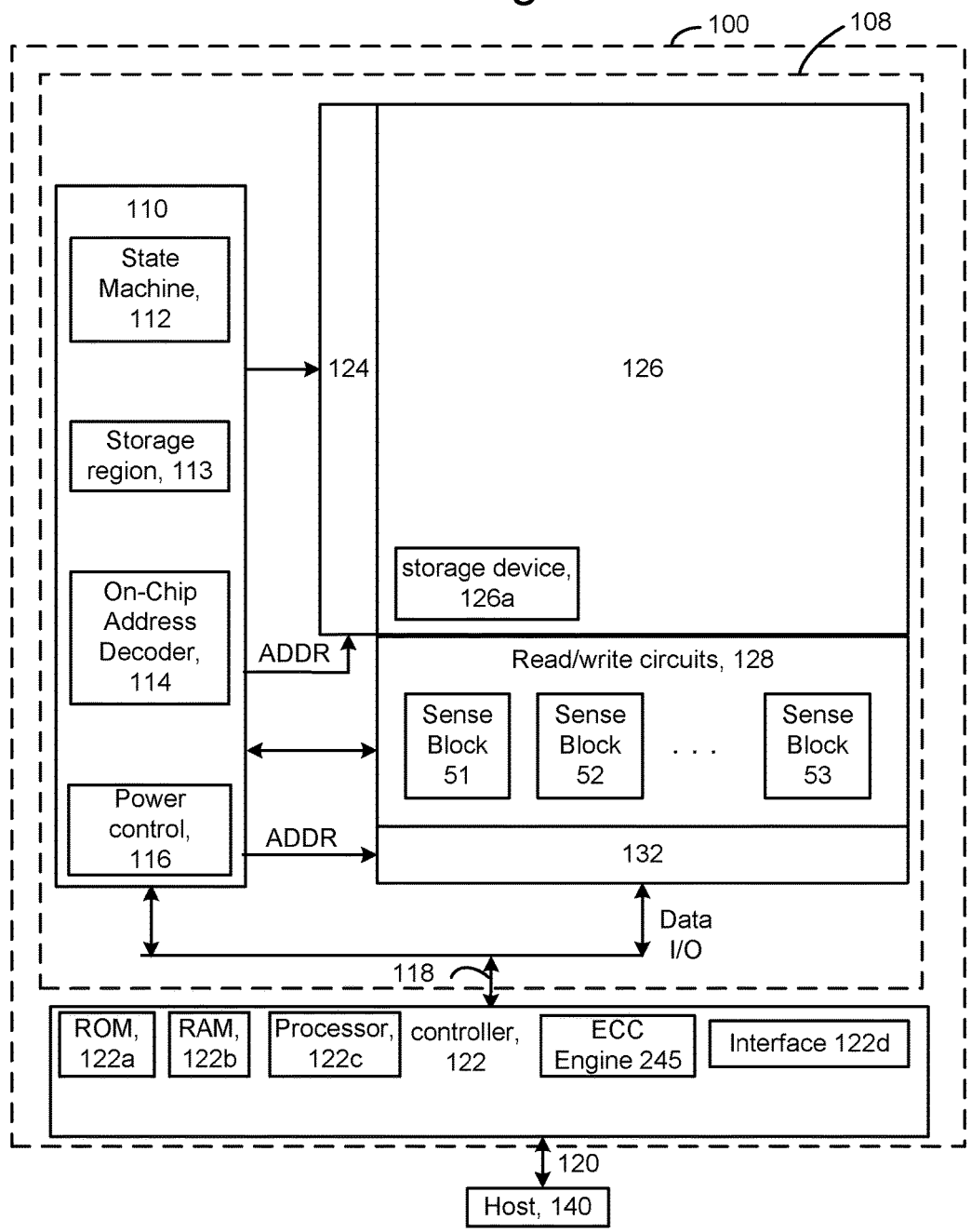
FIG. 1 is a block diagram of an example memory device.

Apparatuses and techniques are described for detecting misalignments in a memory device which affect signal propagation time. In response to the detection, timing parameters for read and verify operations are adjusted to optimize performance. The detection and optimization can be performed for individual sub-blocks, sets of sub-blocks and/or blocks of memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states. In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, in the fabrication process of the 3D memory structure, due to the stress existing inside the silicon wafer after multiple-layer dielectric depositions, etching, and the process to replace dielectric layers with metal layers, misalignments between memory holes and isolation areas (which are used to separate blocks and sub-blocks) can easily occur. Moreover, the misalignment amount usually varies inside one chip at different chip locations. The alignment between the memory holes and the isolation areas determines the resistances of the data word line and select gate lines. For a sub-block, when the distance between the edge of the outer row memory holes and the isolation area is small, the cross sectional area of the word line or select gate line is relatively small so that the resistance is relative large. The width of a conductive layer is inversely proportional to the resistance. When memory hole and isolation area misalignment occurs, the resistance can have a periodic change for sub-blocks within the same block. See FIGS. 14A and 14B.

Further, since the misalignment amount will vary in blocks at different locations, this periodic pattern in resistance will also vary in blocks at different locations inside the same chip. The changes in resistance can impact the read behavior of the memory cells if read and verify parameters are not adjusted for different sub-blocks and blocks based on the misalignment amount. In this case, the overall read/verify speed of the memory will be reduced for all sub-blocks/blocks to accommodate the sub-blocks/blocks with the largest amount of misalignment and highest resistance. This reduces the performance of the memory device.

In some cases, the misalignment amount varies according to other patterns. For example, a progressive increase or decrease in the widths in sub-blocks or blocks may exist. See FIGS. 15A and 15B.

Techniques provided herein address the above and other issues. In one aspect, the amount of memory hole/isolation area misalignment is detected and the read/verify operation timing parameters are adaptively adjusted to improve read and programming performance. The time allocated for a read or programming operation can be reduced for memory cells of word lines which have a relatively low resistance and therefore a relatively short voltage settling time.

In one approach, during wafer sort tests for a chip, an extra test can be added to electrically detect the misalignment amount between memory holes and neighboring isolation area for blocks in different regions of the chip. The process can include on each die tested, selecting a certain number of blocks at several different locations inside the memory array. For each selected block, program random data on the block with an intentionally shortened timing parameter. For example, the timing parameter may control the time used to ramp down the bias on SGD transistors of unselected sub-blocks after channel pre-charge and before programming starts. When this time is too short and the unselected SGD line has a relatively high RC delay, the SGD transistor will not have enough time to ramp down before programming starts. This will lead to a boosting potential loss and program disturb will occur in sub-blocks with a relatively large word line and SGD line resistance.

The process further includes detecting the fail bit count in the tested blocks. If a memory hole/isolation misalignment exists which causes a periodic change in the word line resistance in the sub-blocks, a periodic change of program disturb and fail bit count will also be observed. Based on a pattern in the program disturb and fail bit count information, the amount of misalignment in the tested sub-blocks/blocks can be detected and assessed. This pattern also corresponds to a pattern in the shortest SGD ramp down period which results in no uncorrectable read errors.

Based on the detected misalignment information, read and verify timing parameters can be adjusted for sub-blocks, sets of sub-blocks and blocks in different array locations. For example, word line settling time during sensing can be adjusted and optimized. For sub-blocks with a high word line resistance, a longer word line settling time can be used to guarantee the sensing accuracy while a shorter word line settling time can be used for sub-blocks which have a lower word line resistance. In this way, a longer word line settling time is not needed for all the blocks during read/verify to accommodate the worst case word line resistance. The overall read/verify speed of the memory device can therefore be improved. Moreover, optimum timing parameters for other blocks or sub-blocks can be provided by extending the pattern and without the need to test the other blocks or sub-blocks.

These and other features are discussed herein.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . ,53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
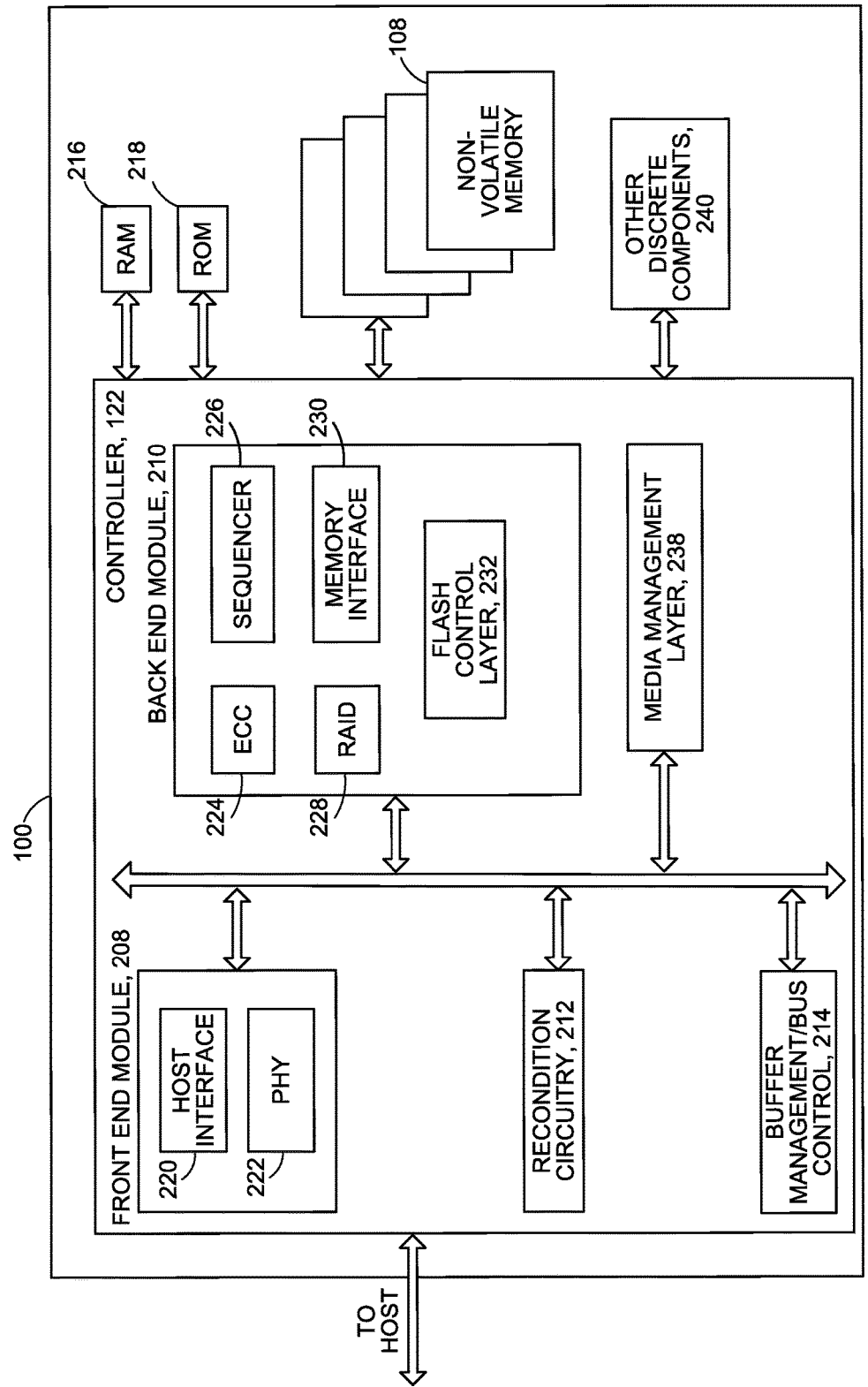
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example.

For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
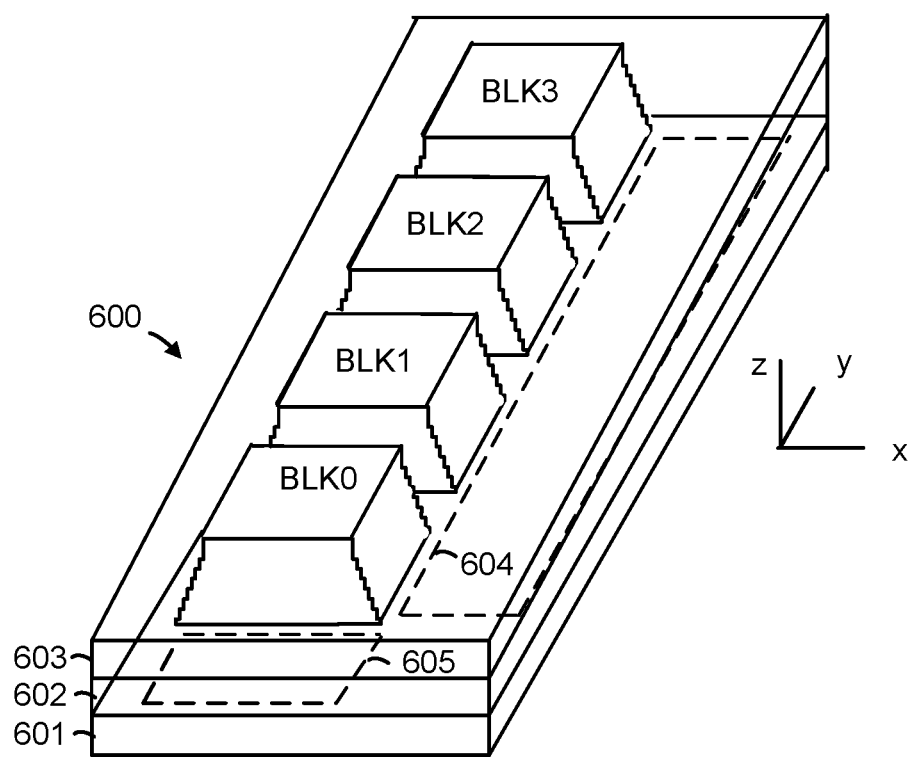
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. Voltage detectors for bit lines may be located in this peripheral area 605, in one approach. In this case, the blocks BLK0, BLK1, BLK2 and BLK3 are at progressively further distances from the voltage detectors.

The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. The block comprises conductive layers spaced apart vertically, and the conductive layers spaced apart vertically comprise word lines connected to the memory cells and select gate lines connected to SGD and SGS transistors.

In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Local interconnects, such as interconnect 617, may be provided periodically across the stack. See, e.g., interconnects 1020, 1022 and 1024 in FIG. 10E. The local interconnects may be metal-filled slits which extend through the stack, such as to connect the source line/substrate to a line above the stack. The metal 617c is isolated from the word line layers by an insulating material 617d. The slits may be used during the formation of the word lines and subsequently filled with metal. A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is in contact with the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, the use of dummy memory cells is optional and one or more may be provided. Also, one or more SGD transistors and one or more SGS transistors may be provided in a memory string.

Figure 10D:
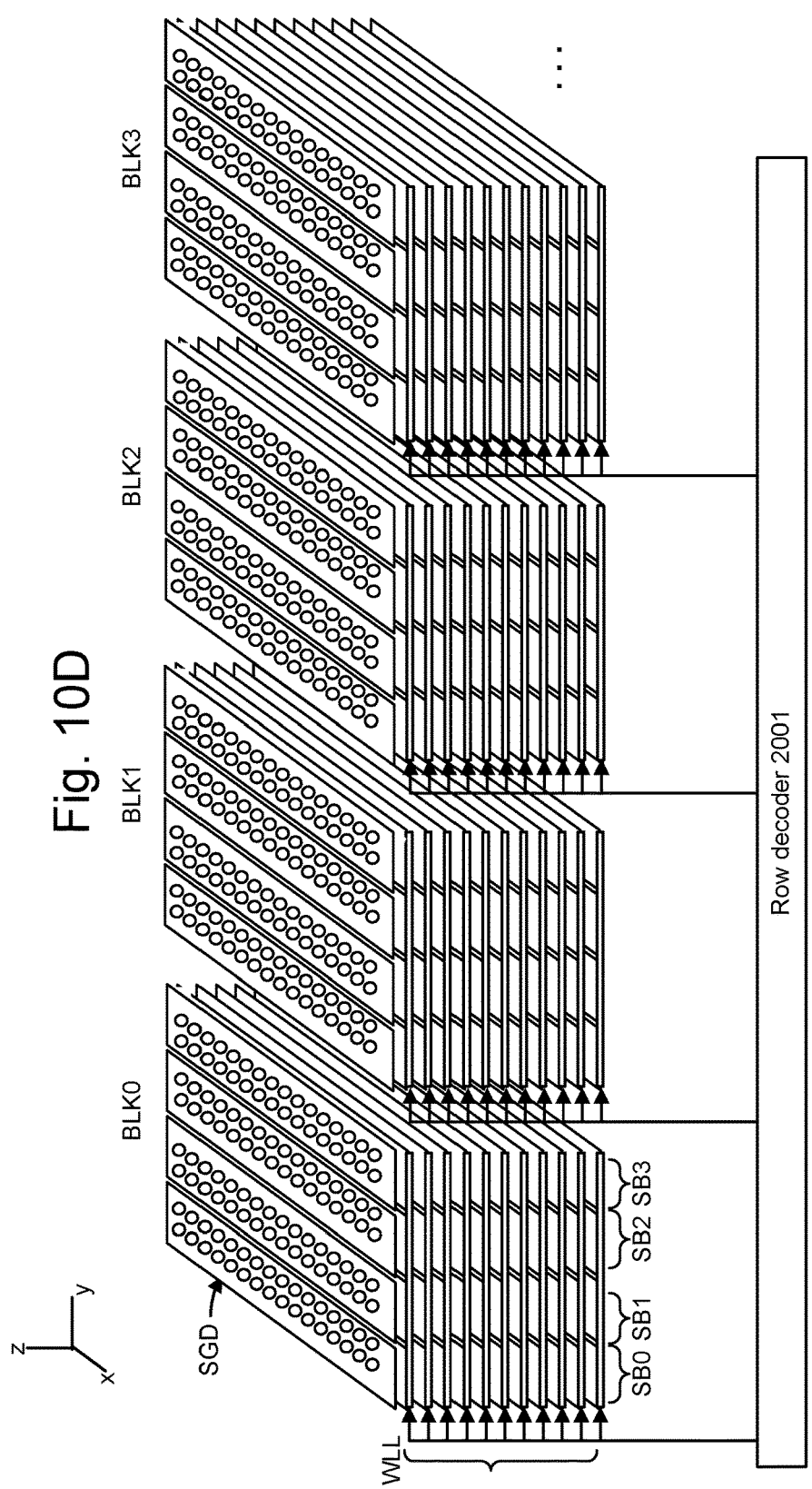
FIG. 10D depicts a perspective view of a set of blocks consistent with FIG. 10B.

An insulating region IR may be provided to separate portions of the SGD layers from one another to provide one independently driven SGD line per sub-block. In this example, the word line layers are common to two adjacent sub-blocks. See FIG. 10A. In another possible implementation, the insulating region extends down to the substrate to separate the word line layers. See FIG. 10B. In this case, the word line layers are separate in each sub-block. Although, in either case, the word line layers of a block can be joined at their ends to one another so that they are commonly driven within a block, as depicted in FIGS. 10C and 10D.

FIG. 5 depicts an example transistor 500. The transistor comprises a control gate CG, a drain D, a source S and a channel CH. During an erase operation, the transistor has a positive channel-to-control gate voltage. In the case of a memory cell transistor, the control gate voltage can be set to a low value such as 0 V so that the channel-to-control gate voltage is high enough to repel electrons from the charge trapping layer and thereby lower the Vth of the memory cell. In the case of a select gate transistor, the control gate voltage can be set to a higher value such as 10-12 V or floated so that the channel-to-control gate voltage is not high enough to lower the Vth of the transistor.

Figure 6:
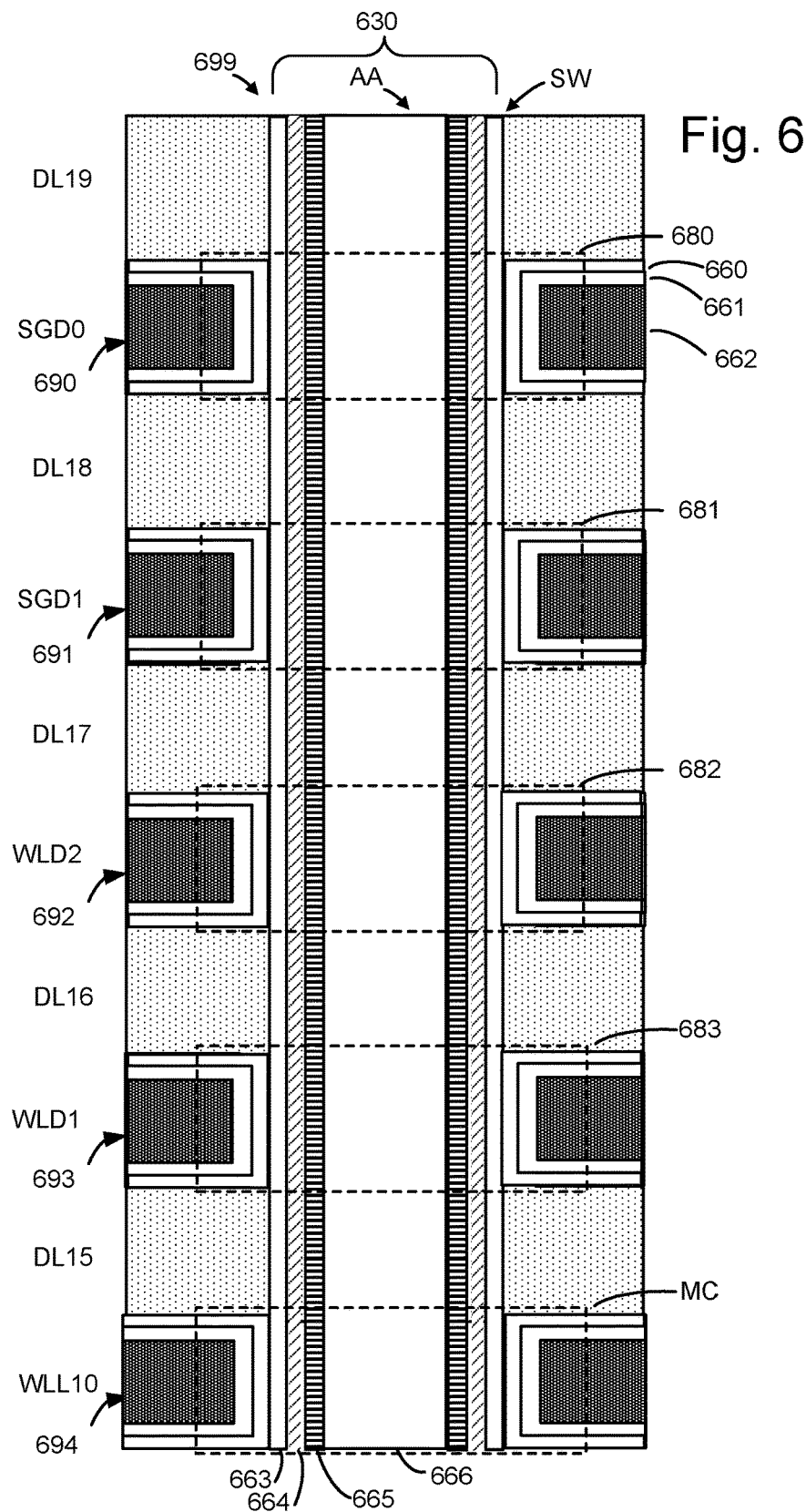
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
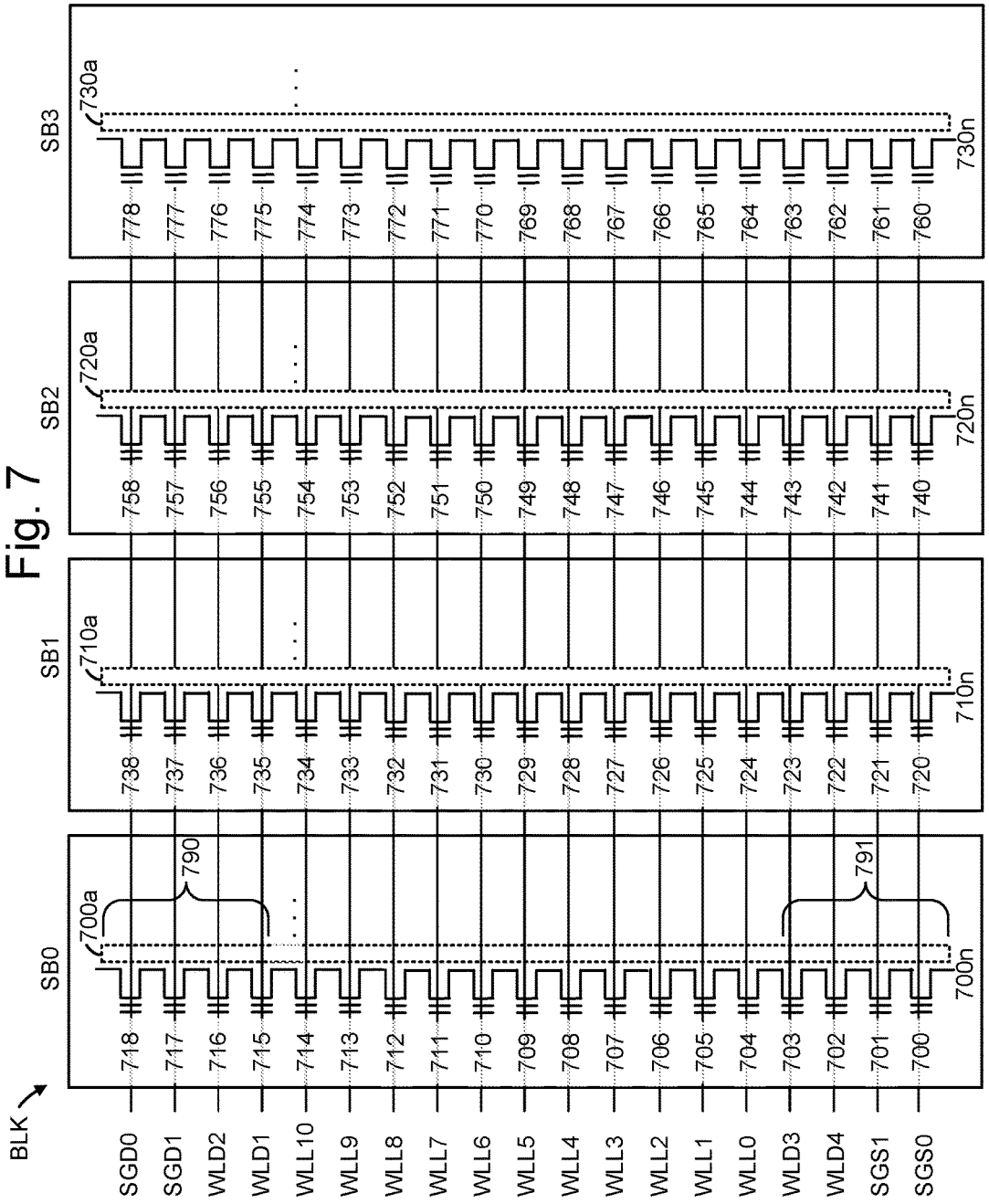
FIG. 7 depicts an example view of NAND strings in sub-blocks in a 3D configuration which is consistent with FIG. 4.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 8:
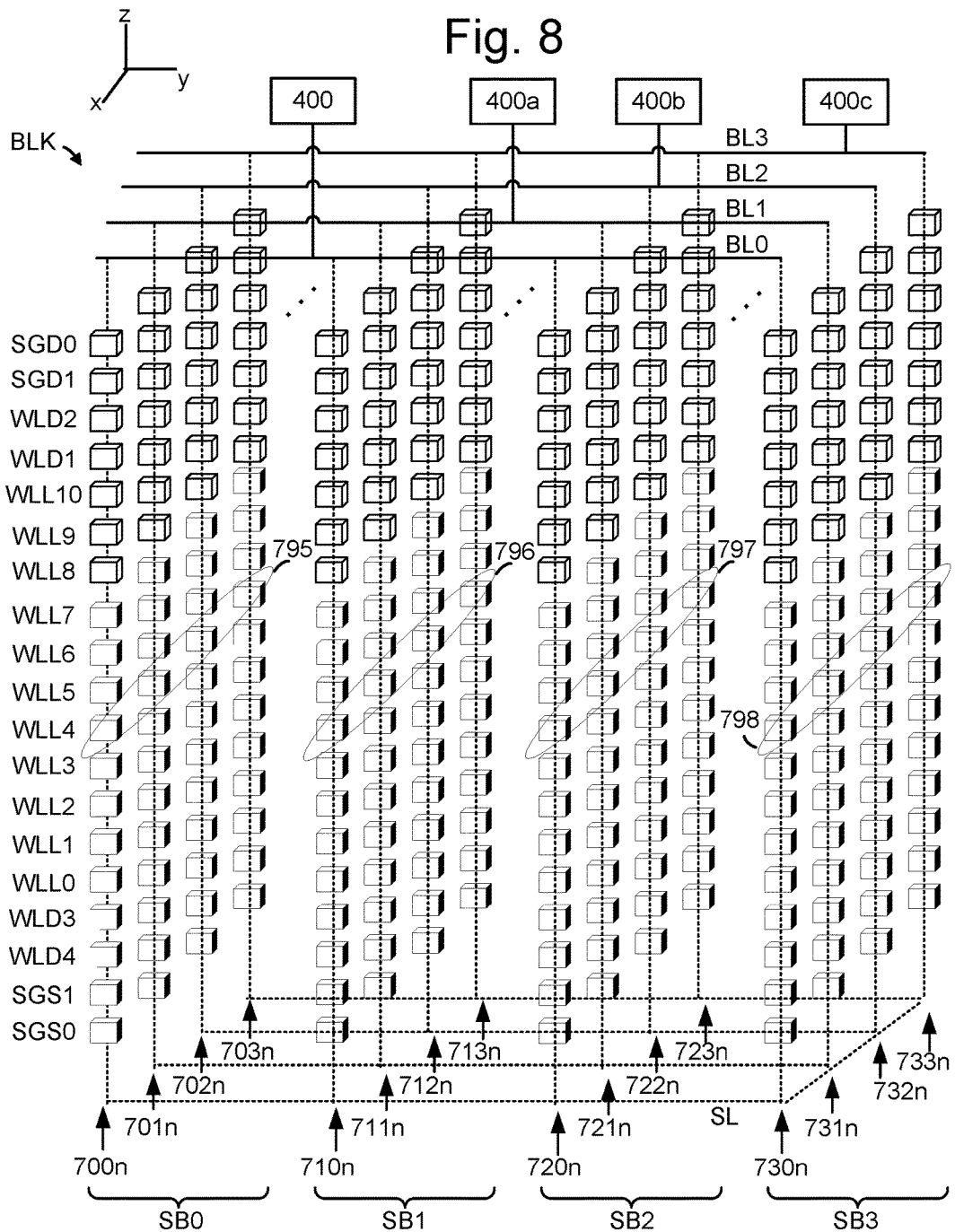
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings, e.g., vertical strings, which extend upward from a substrate.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4.

Figure 9:
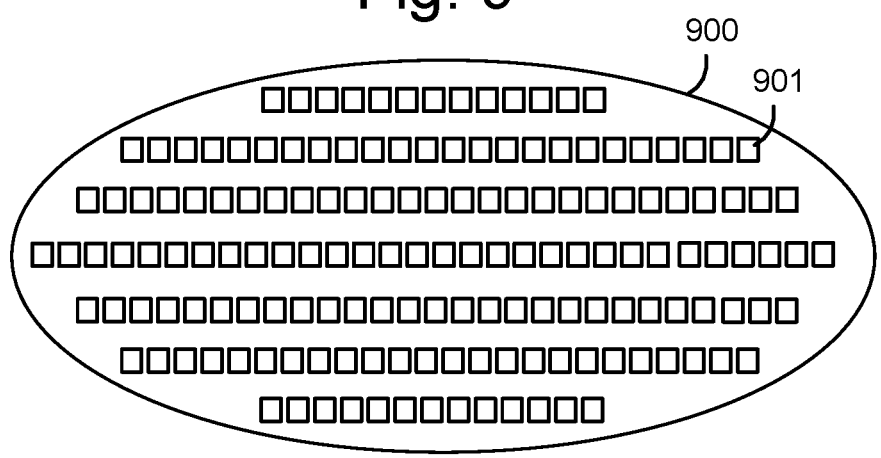
FIG. 9 depicts an example of chips in different locations on a wafer.

FIG. 9 depicts an example of chips (integrated circuits) in different locations on a wafer 900. Each square represents a chip, such as an example chip 901. As mentioned, the fabrication process can result in variations in the word line and SGD line resistances in different chips and in different sub-blocks, sets of sub-blocks and/or blocks of one chip. In some cases, chips with significant misalignments are concentrated in one location on the wafer. In other cases, the misalignment are in chips throughout the wafer.

FIG. 10A depicts an example cross-sectional view of a block BLK0 of memory cells where word line layers are shared among two sub-blocks. Specifically, one set of word line layers is shared among SB0 and SB1 (in a set of sub-blocks 1050) and another set of word line layers is shared among SB2 and SB3 (in a set of sub-blocks 1051). The local interconnects (LI) are provided on both sides of the block and in the middle of the block, between SB1 and SB2. The insulating regions, discussed in connection with FIG. 4, provide separate SGD layers for each sub-block. The conductive layers have example widths in the y direction, e.g., w1, w2, w3 and w4 for the SGD layers in SB0, SB1, SB2 and SB3, respectively, and w5 and w6 for the shared word lines layers in the sets of sub-blocks 1050 and 1051, respectively.

The widths are uniform within each set of sub-blocks for all of the word line layers, in this example. The conductive layers are elongated and have a common length L in a first direction (x direction—see FIGS. 10C and 10D), and the width of the conductive layers extends in a second direction (y direction), perpendicular to the first direction and perpendicular to a direction in which the vertical strings extend (z direction).

FIG. 10B depicts an example cross-sectional view of a block BLK0 of memory cells where word line layers are provided for each sub-block. Here, the insulating regions (IR) extend down through the stack so that the word line layers are separated in each sub-block. Although, in FIGS. 10A and 10B, the word line layers may be joined at an end region so they can be commonly driven in a block. See FIGS. 10C and 10D. The widths may be uniform within each sub-block for all of the word line layers, in this example.

FIG. 10C depicts a perspective view of a set of blocks consistent with FIG. 10A. Blocks BLK0, BLK1, BLK2 and BLK2 are depicted. The word line layers (WLL) in each block are depicted along with example SGD lines. One SGD line is provided in each sub-block. BLK0 includes sub-blocks SB0, SB1, SB2 and SB3. Each circle represents a memory hole or string. The sub-blocks are elongated in the x direction and contain thousands of memory strings in practice. Additionally, many more blocks beyond those depicted are arranged in a row on the substrate in the y-direction. The word line layers and SGD/SGS layers may receive voltages from a row decoder 2001. See also FIG. 20. The sets of adjacent sub-blocks 1050 and 1051 as discussed in connection with FIG. 10A are depicted.

FIG. 10D depicts a perspective view of a set of blocks consistent with FIG. 10B. The word lines layers comprise separate elongated portions for each sub-block discussed in connection with FIG. 10B.

FIG. 10E depicts a cross-sectional view of a block BLK0 of memory cells along a word line layer, such as any of WLL0-WLL10, consistent with the structure of FIGS. 4 and 10B. The word line layers 1001, 1002, 1003 and 1004 are elongated and have a common length L for each sub-block SB0, SB1, SB2 and SB3, respectively, in a block BLK0. The memory holes or pillars in each word line layer, such as example memory hole 1025, are depicted by circles. The memory holes are arranged in rows along the length of each word line layer. For example, the word line layer 1001 includes rows R1-R4 of memory holes. The memory holes are staggered in adjacent rows to reduce the size of the word line layer. The word line layers 1001, 1002, 1003 and 1004 have widths w1, w2, w3 and w4, respectively, in they direction. In one example, w1>w2 and w3>4. Moreover, in some cases, w1 and w3 are approximately equal and w2 and w4 are approximately equal. The length L is in the x direction.

In this example, the pattern is that wider word line layers alternate with narrower word line layers in a block. Moreover, the narrower word line layers have approximately the same width w2 or w4, and the wider word line layers have approximately the same width w1 or w3. The width is a function of a misalignment of the outer rows of memory holes relative to the adjacent insulation filled spacer or local interconnect. The insulation filled spacer or local interconnect are examples of isolation areas. Thus, the width is a function of a misalignment of the outer rows of memory holes relative to the adjacent isolation area.

For example, in the word line layer 1001, row R1 is at a distance d1 from the local interconnect 1020 and row R4 is at a distance d2 from the insulation filled spacer 1021. In the word line layer 1002, row R5 is at a distance d2 from the insulation filled spacer 1021 and row R8 is at a distance d1 from the local interconnect 1022. In the word line layer 1003, row S1 is at a distance d1 from the local interconnect 1022 and row S4 is at a distance d2 from the insulation filled spacer 1023. In the word line layer 1004, row S5 is at a distance d2 from the insulation filled spacer 1023 and row S8 is at a distance d1 from the local interconnect 1024.

The rows of memory holes which are adjacent to an isolation area in adjacent word line layers are spaced apart from the isolation area by an essentially common amount in this example. For example, R4 and R5 are spaced apart from the insulation filled spacer 1021 by d2, R8 and S1 are spaced apart from the local interconnect 1022 by d1, and S4 and S5 are spaced apart from the insulation filled spacer 1023 by d2. Various other patterns are possible in the word line layer width and in the spacing between rows and isolation areas. For example, the widths can become progressively greater or smaller across a row of adjacent blocks. See FIGS. 15A and 15B.

The example block includes local interconnects 1020, 1022 and 1024 which alternate with insulation filled spacers 1021 and 1023 across a width of the block (in the y direction) in this example. Other configurations are possible.

The word line layers are connected at one end by a connector 1030 which allows the word line layers to be driven by a common voltage driver, in this example.

Figure 10F:
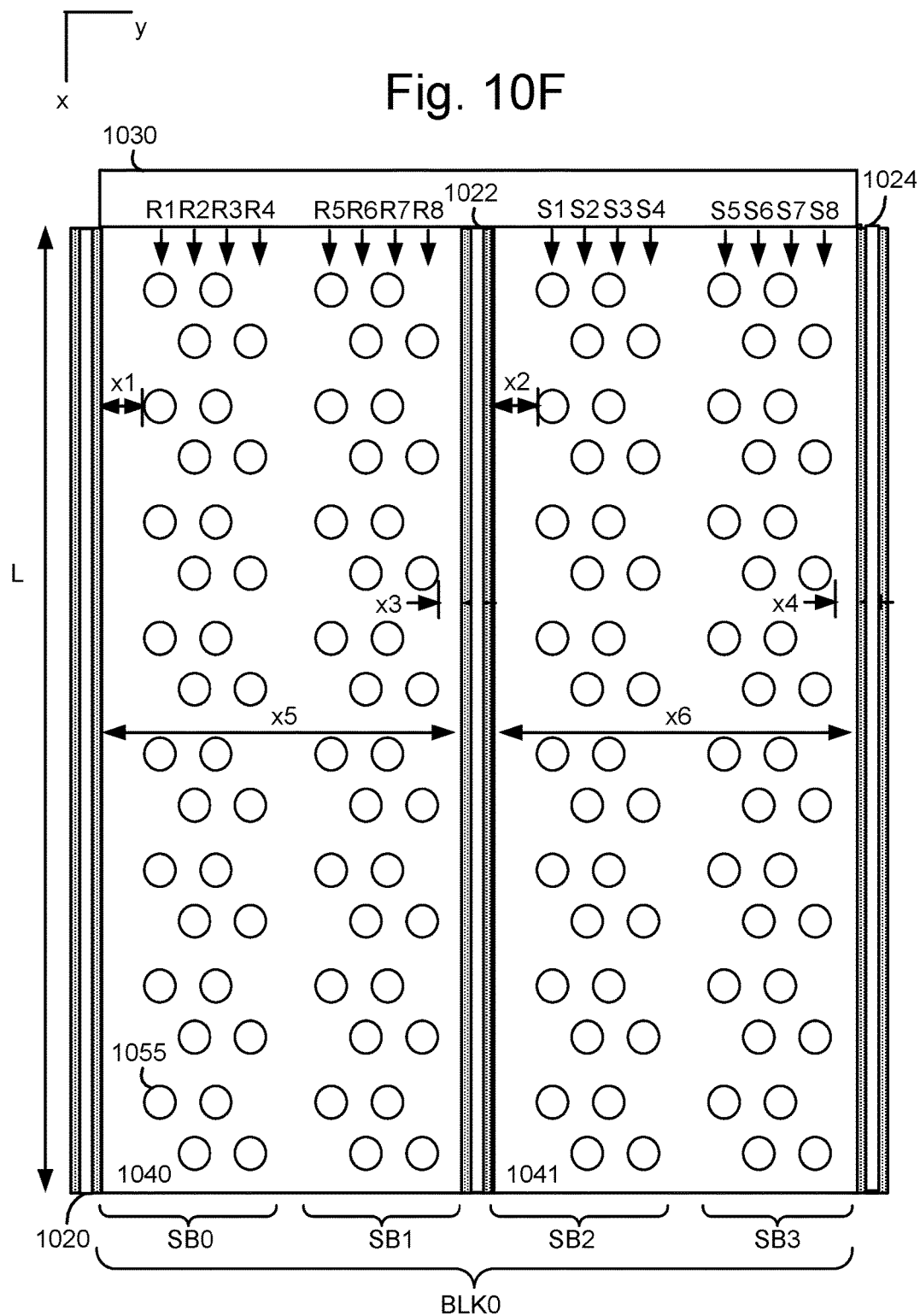
FIG. 10F depicts a cross-sectional view of a block BLK0 of memory cells along a word line layer consistent with the structure of FIGS. 4 and 10A.

FIG. 10F depicts a cross-sectional view of a block BLK0 of memory cells along a word line layer consistent with the structure of FIGS. 4 and 10A. In this example, the word line layer 1040 is shared by SB0 and SB1, and the word line layer 1041 is shared by SB2 and SB3. The word line layers are elongated and have a common length L for each sub-block.

The memory holes or pillars in each word line layer, such as example memory hole 1055, are depicted by circles. The word line layers 1040 and 1041 includes rows R1-R8 and S1-S8 of memory holes, respectively. The word line layers 1040 and 1041 have widths x5 and x6, respectively, in the y direction. These widths can be the same or different according to a pattern. Also, R1 is at a distance x1 from the LI 1020, R8 is at a distance x3 from the LI 1022, S1 is at a distance x2 from the LI 1022, and S8 is at a distance x4 from the LI 1024. These distances can be the same or different according to a pattern.

Figure 11A:
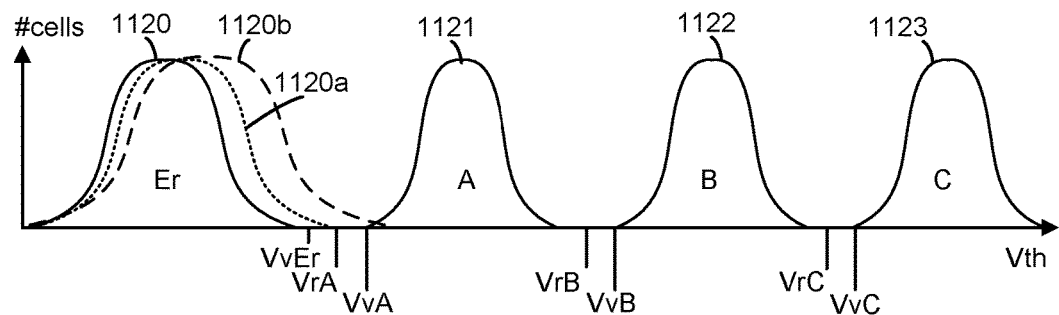
FIG. 11A depicts an example threshold voltage (Vth) distribution of a set of memory cells connected to a word line, showing the effects of program disturb, where four data states are used.

FIG. 11A depicts an example threshold voltage (Vth) distribution of a set of memory cells connected to a word line, showing the effects of program disturb, where four data states are used. A Vth distribution 1120 is provided for erased (Er) state memory cells with no program disturb. Three Vth distributions 1121, 1122 and 1123 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. Read voltages VrA, VrB and VrC are used to read data from a set of cells having this Vth distribution. An erase verify voltage VvEr is used in an erase-verify test to determine whether the erase operation is completed.

In one approach, the memory cells store separate pages of data. For example, with four bits per cell as in this example, there will be a lower page and an upper page. The lower page is read using VrA and VrC and the upper page is read using VrB. An example encoding of bits for the Er, A, B and C states is 11, 10, 00 and 01, respectively, in the format of upper page (UP) bit/lower page (LP) bit.

The Vth distribution 1120a represents the erased state cells with a relatively small amount of program disturb. Program disturb refers to inadvertent programming of memory cells and can occur in an unselected memory string while cells in a selected memory string are being programmed. A small amount of program disturb is acceptable when the upper tail of the erased state Vth distribution does not exceed the read voltage VrA. However, when there is a relatively large amount of program disturb as depicted by the Vth distribution 1120b, read errors can result. In some cases, there are uncorrectable read errors. As described further below, e.g., in connection with the processes of FIGS. 12A and 12B, a SGD transistor ramp down period can be adjusted to control the position of the upper tail of the erased state Vth distribution and the resulting number of read errors. A shortest acceptable SGD ramp down period can then be determined, and this can be cross-referenced to a shortest acceptable word line voltage ramping period.

Figure 11B:
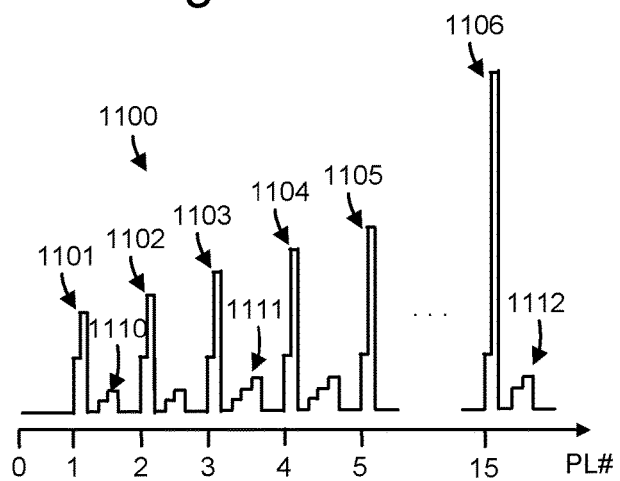
FIG. 11B depicts a waveform of an example programming operation.

FIG. 11B depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 18A-18C.

Each program voltage includes two steps, in one approach. Further, Incremental Step Pulse Programing (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After additional program loops, B- and C-state verify voltages of VvB and VvC (waveform 1112) may be applied after the final program voltage 1106.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read voltages, the system can determine the data state which is represented by a memory cell. These read voltages are demarcation voltages because they demarcate between Vth ranges of different data states.

Figure 12A:
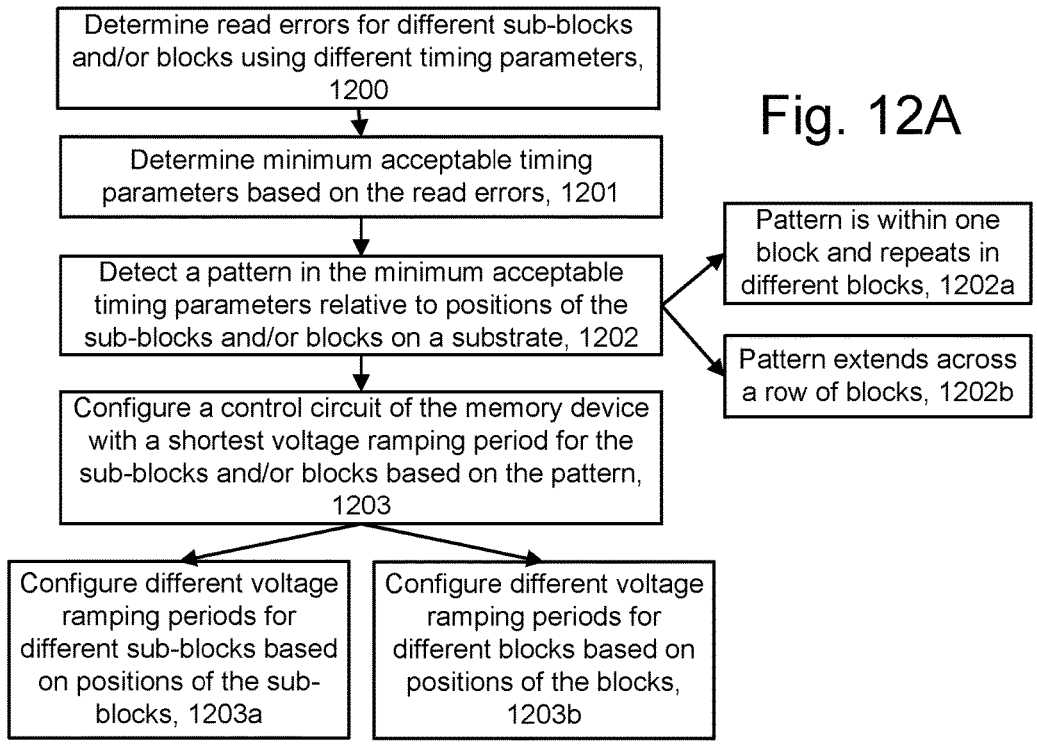
FIG. 12A depicts an example process for configuring different voltage ramping periods for different sub-blocks and/or blocks.

FIG. 12A depicts an example process for configuring different voltage ramping periods for different sub-blocks and/or blocks. Step 1200 includes determining read errors for different sub-blocks and/or blocks using different timing parameters. One example of a timing parameter is an SGD ramp down period, as discussed in connection with FIG. 12B. Step 1201 includes determining minimum acceptable timing parameters based on the read errors. Step 1202 includes detecting a pattern in the minimum acceptable timing parameters relative to positions of the sub-blocks and/or blocks on a substrate. See, e.g., FIG. 14A to 15B. Block 1202a indicates the pattern is within one block and repeats in different blocks. See, e.g., FIGS. 14A and 14B. Block 1202b indicates the pattern extends across a row of blocks. See, e.g., FIGS. 15A and 15B. This is an example of a progressive increase and/or decrease in the timing parameters along the row.

Step 1203 includes configuring a control circuit of the memory device with a shortest acceptable voltage ramping period for the sub-blocks and/or blocks based on the pattern. For example, this can be a period in which a sensing voltage is ramped up on a word line. See, e.g., FIGS. 17A and 18A. Step 1203 can be implemented using step 1203a and/or step 1203b. Step 1203a includes configuring different voltage ramping periods for different sub-blocks based on positions of the sub-blocks. See, e.g., FIGS. 14A and 14B. Step 1203b includes configuring different voltage ramping periods for different blocks based on positions of the blocks. See, e.g., FIGS. 15A and 15B.

Figure 12B:
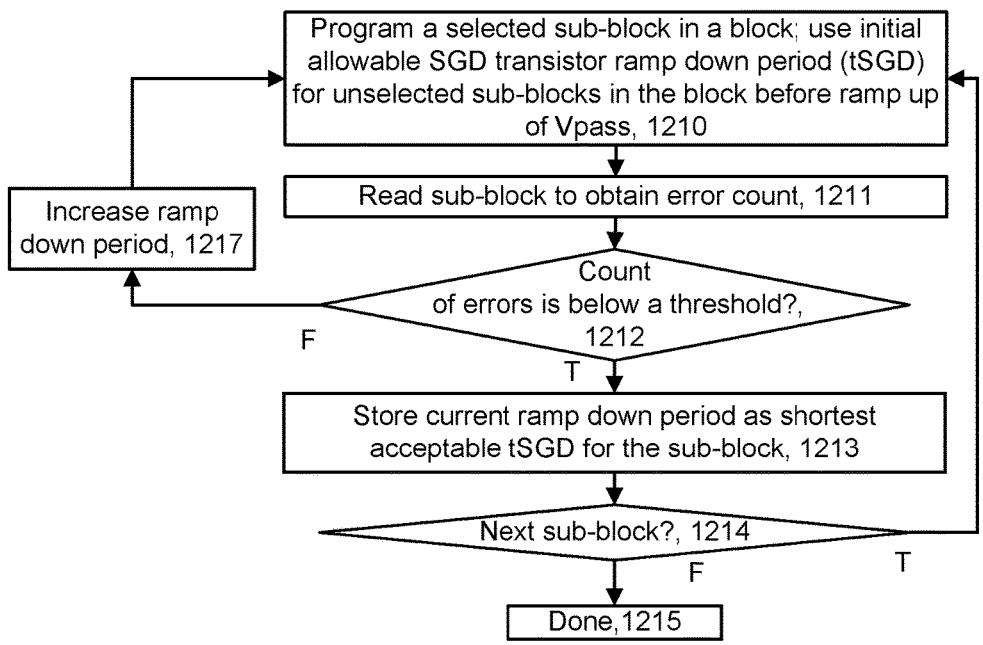
FIG. 12B depicts an example process for determining a shortest acceptable ramp down period for each sub-block of a block, consistent with FIG. 12A.

FIG. 12B depicts an example process for determining a shortest acceptable ramp down period for each sub-block of a block, consistent with FIG. 12A. Step 1210 includes programming a selected sub-block in block. The step also includes using an initial allowable SGD transistor ramp down period (tSGD) (e.g., tp6 in FIG. 18D or tp8 in FIG. 18E) for unselected sub-blocks in the block. This is a period in which the control gate voltage of the SGD transistor is allowed to ramp down, e.g., from Vpass to 0 V, before a ramp up of Vpass (a pass voltage) on unselected word lines. When memory strings in a selected sub-block of a block are programmed, the memory strings in the remaining, unselected sub-blocks of the block have their channel regions boosted to prevent program disturb. This boosting can include a pre-charge phase which is before the program voltage. See, e.g., FIG. 18A to 18C. In the pre-charge phase, the SGD transistors of the unselected sub-blocks are made conductive by elevating the SGD control gate voltage, e.g., to 3-4 V, and applying a smaller voltage, e.g., 2 V on the bit lines. This voltage is passed to the channels of the unselected memory strings to boost them to about 2 V. Subsequently, the SGD control gate voltage is ramped down, e.g., to 0 V, to provide the SGD transistors in the unselected sub-blocks in a non-conductive state even if the bit line voltage remains at its elevated level. This occurs just prior to a ramp up in the pass voltage for the unselected word lines. This ramp up further boost the channels of the unselected memory strings due to capacitive coupling.

However, the capacitive coupling requires the SGD transistors to be in a non-conductive state. If the ramp down has not fully occurred, the SGD transistors may be partially conductive when the pass voltage is initially ramped up. This reduces the boosting in the channels and can result in program disturb. To minimize the programming time, the allocated SGD ramp down period should be as short as possible while ensuring that the SGD transistors are in a non-conductive state when the pass voltage starts to ramp up. The process of FIG. 12B tests different values of the SGD ramp down period until a shortest acceptable period is determined. This in turn is used to set an optimal word line voltage ramping period such as in a read or verify operation. The word line voltage ramping period should also be as short as possible while ensuring that the voltage settles at the level used for sensing.

The pre-charge also occurs in the selected sub-block. Referring also to FIG. 18A to 18C, one difference compared to the unselected sub-blocks is that the SGD control gate voltage is ramped down to a level which is comparable to the bit line voltage, e.g., to 2 V, instead of 0 V. Individual SGD transistors in the selected sub-block can therefore be set in a conductive or non-conductive state according to the respective bit line voltage (Vbl). Vbl in turn is set low or high based on whether the associated memory string is selected or unselected, respectively, for programming in a particular program loop. A SGD transistor is in a conductive state if its control gate-to-drain voltage exceeds it Vth, e.g., about 1 V.

Step 1211 includes reading the sub-block to obtain an errors count. In one approach, the error count involves erased state cells which are read as A state cells due to the upper tail of the Vth distribution. Step 1210 can involve programming of memory cells of one or more word lines in the sub-block and step 1211 can involve reading of these memory cells. Decision step 1212 determines if the error count is below a threshold, such as a maximum number of correctable errors of an ECC process. See, e.g., FIG. 13A. If decision step 1212 is false, the ramp down period is increased at step 1217 and step 1210 is repeated with additional programming for the sub-block. If decision step 1212 is false, step 1210 is repeated to program the next sub-block in the block. If decision step 1212 is true, step 1213 stores the current ramp down period as the shortest acceptable tSGD. This ramp down period, or allowed time for the ramp down, results in an acceptable count of errors. Subsequently, a decision step 1214 determines whether there is a next sub-block to program in the block. For example, SB0 may be programmed first, while SB1-SB3 are unselected blocks. SB1 is then programmed while SB0, SB2 and SB3 are unselected blocks. SB2 is then programmed while SB0, SB1 and SB3 are unselected blocks. SB3 is then programmed while SB0-SB2 are unselected blocks.

If decision step 1214 is false, step 1215 indicates that the process is done. If decision step 1214 is true, step 1210 is repeated for the next block. The process of FIG. 12C can follow next.

Figure 12C:
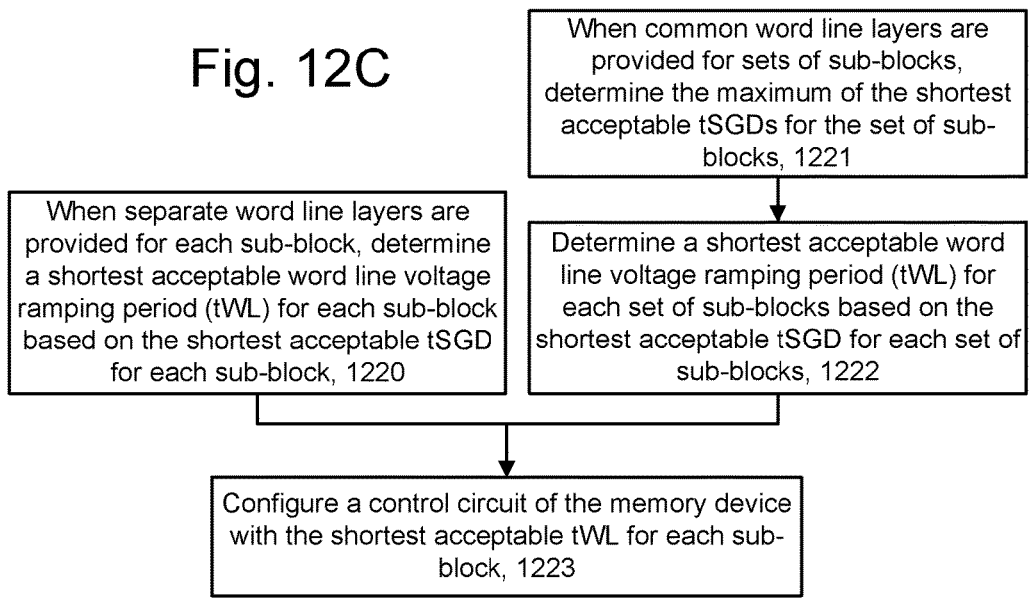
FIG. 12C depicts an example process for configuring a control circuit with a shortest acceptable voltage ramping period for word lines in a sub-block, consistent with FIG. 12B.

FIG. 12C depicts an example process for configuring a control circuit with a shortest acceptable voltage ramping period for word lines in a sub-block, consistent with FIG. 12B. Step 1220 is followed for a configuration of a memory device such as in FIGS. 10B and 10D. When separate word line layers are provided for each sub-block, step 1220 includes determining a shortest acceptable word line voltage ramping period (tWL) for each sub-block based on the shortest acceptable tSGD for each sub-block. See, e.g., FIG. 13B. tWL can be a period in which a voltage is allowed to ramp up or down on a word line. Step 1223 includes configuring a control circuit of the memory device with the shortest acceptable tWL for each sub-block. In one possible approach, the shortest acceptable tWL is different for each sub-block. In another possible approach, the shortest acceptable tWL is different for two or more sub-blocks in a block. Note that one or more word line voltage ramping periods can be determined. For example, the ramping period for a transition from 0 V to VrA may be different than the ramping period for a transition from VrA to VrB in FIG. 17A.

Step 1221 is followed for a configuration of a memory device such as in FIGS. 10A and 10C. When common word line layers are provided for sets of sub-blocks, step 1221 includes determining the maximum of the shortest acceptable tSGDs for the set of sub-blocks. For example, for the set 1050 of sub-blocks (SB0 and SB1) in FIG. 10C, there will be a tSGD for SB0 and a tSGD for SB1. Whichever is greater is selected since the WL voltage ramping period should be based on the largest tSGD. Step 1222 includes determining a shortest acceptable word line voltage ramping period (tWL) for each set of sub-blocks based on the shortest acceptable tSGD for each set of sub-blocks. Step 1223 then follows.

The process of FIG. 12B-12C can be performed during the wafer sort tests for a chip, for instance. In another approach, the process is performed after the memory device has been delivered to the end user.

The voltage ramping period is relatively larger when the width of the conductive layer is relatively smaller and the resistance is therefore relatively larger. The widths of the conductive layers of the sub-blocks in a direction along the row (y direction in FIG. 16) may vary according to a repeating pattern along the row, in which case the voltage ramping period is a function of the repeating pattern.

A method for configuring a memory device includes: performing multiple programming operations for sub-blocks of one or more blocks of memory cells, wherein the memory cells are arranged in vertical strings, each vertical string comprises a drain end select gate transistor, each sub-block comprises conductive layers spaced apart vertically including word lines connected to the memory cells and a select gate line connected to the drain end select gate transistors, and an allowable voltage ramp down period on the select gate line for unselected sub-blocks before a ramp up of voltages on unselected word lines among the word lines connected to the memory cells is set to be different in each of the programming operations; for each of the sub-blocks, perform a read operation after each programming operation, obtaining a count of a number of read errors, and determining a shortest value of the voltage ramping period for which the count of read errors is below a threshold; determining a pattern in the shortest value for the sub-blocks relative to positions of the sub-blocks on a substrate; and configuring a control circuit for use in a subsequent operation involving a sub-block of another block of memory cells with a voltage ramping period, wherein the configuring is based on the pattern and a position of the sub-block of the another block relative to the selected sub-blocks.

Figure 13A:
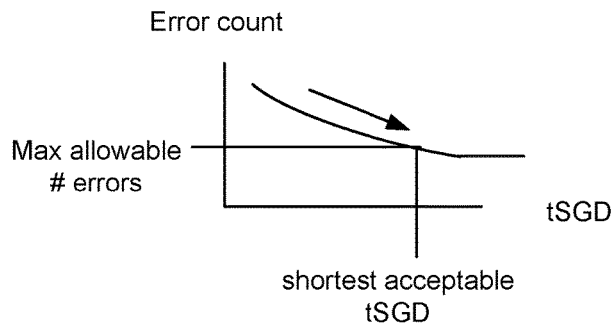
FIG. 13A depicts a plot of an error count versus an SGD voltage ramp down period to determine a shortest acceptable SGD voltage ramp down period, consistent with FIG. 12B.

FIG. 13A depicts a plot of an error count versus an SGD voltage ramp down period to determine a shortest acceptable SGD voltage ramp down period (tSGD), consistent with FIG. 12B. As mentioned, the initial value of tSGD in the process of FIG. 12B can be relatively short such that an excessive number of read errors is likely to occur. The arrow indicates that tSGD is incrementally increased until the error count falls below the maximum allowable number of errors. tSGD at this point is at its shortest acceptable value. The maximum allowable number of errors may correspond to the maximum correctable number of errors using an ECC process minus a margin.

Figure 13B:
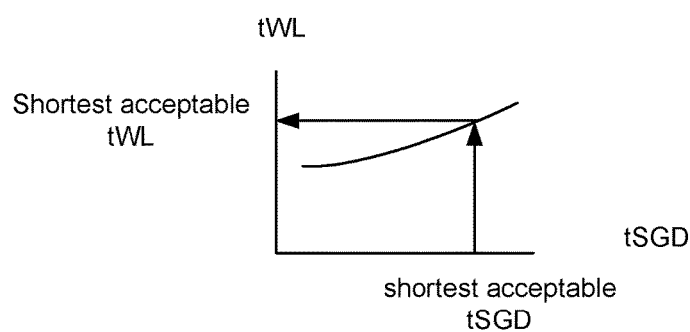
FIG. 13B depicts a plot of a word line voltage ramping period versus a SGD voltage ramp down period, consistent with FIG. 13A.

FIG. 13B depicts a plot of a word line voltage ramping period (tWL) versus a SGD voltage ramp down period (tSGD), consistent with FIG. 13A. Using the shortest acceptable tSGD, a corresponding shortest acceptable tWL can be determined. Generally, the shortest acceptable tWL will be proportional to the shortest acceptable tSGD. tWL may be longer than, shorter than, or the same as, tSGD. The magnitude of the word line voltage ramping during a sensing operation, e.g., 0.5 V is typically less than the amount of the SGD ramp down, e.g., 2-3 V. This indicates the shortest acceptable tWL can be less than the shortest acceptable tSGD. However, the need for settling of the word line voltage at a precise level for sensing can require additional time. An optimum relationship between the shortest acceptable tSGD and the shortest acceptable tWL can be determined from testing and experimentation.

In theory, an experiment can be performed in which the word line voltage ramping period is varied and the error count is obtained. However, the process of FIGS. 12A and 12B provides a better indicator of word line resistance because it involves errors caused by program disturb, where these errors have a clear signature in the form of an increase in the upper tail of the erased state. Errors caused by insufficient word line ramp up time are more likely to be spread out across different data states. Moreover, other factors such as detrapping of cells in the programmed state (which changes the Vth of the cells) make it harder to isolate errors caused by word line ramping time.

FIG. 14A depicts a plot of ramping period versus sub-block for a row of sub-blocks, consistent with FIG. 10E. This example is also consistent with the memory device of FIGS. 10B and 10D. Plot 1401 shows how tSGD alternates between lower and higher values for adjacent sub-blocks in a row, including sub-blocks SB0-SB3 in BLK0 and SB0a-SB3a in BLK1. Plot 1400 shows how tWL corresponds to tSGD and also alternates between lower and higher values for the adjacent sub-blocks. In this example, tWL>tSGD. However, it can be smaller than, or equal to, tSGD in other possible implementations.

The widths of the sub-blocks are inversely proportional to the ramping periods. Thus, the width may alternate between higher and lower values as the ramping period alternates between lower and higher values, respectively.

By detecting the pattern in the shortest acceptable ramping periods for the sub-blocks in BLK0 through the evaluation process of FIG. 12B, for example, the ramping periods can be set similarly for the sub-blocks in the adjacent BLK1 without performing the evaluation process of FIG. 12B on BLK1. The pattern may be of the shortest acceptable tSGD and/or the shortest acceptable tWL, as these are corresponding patterns. This saves time, such as during the wafer sort tests for a chip. For example, if testing reveals the pattern of low, high, low and high ramping periods in SB0-SB3 of BLK0, it can be concluded that low, high, low and high ramping periods can be used for SB0a-SB3a of BLK1 without testing BLK1. Or, if testing reveals the pattern of a gradual decrease in ramping period over successive blocks or sub-blocks, this trend can be extended to set a ramping period in an adjacent block or sub-block for which testing has not been performed.

In this example, the widths of the conductive layers of the sub-blocks in a direction along the row are alternatingly relatively larger and smaller along the row, and the voltage ramping period is relatively smaller and larger for the sub-blocks for which the widths of the conductive layers are alternatingly relatively larger and smaller, respectively.

Generally, the sub-blocks (SB0-SB3) of one or more blocks (BLK0-BLK31) are adjacent to one another in a row 1600 (FIG. 16); the pattern indicates that the shortest value of tSGD is alternatingly higher and lower for successive sub-blocks of adjacent sub-blocks (SB0a-SB3a) in the row; and tWL is configured to be alternatingly higher and lower for the successive sub-blocks in the row as the shortest value is alternatingly higher and lower, respectively.

Figure 15A:
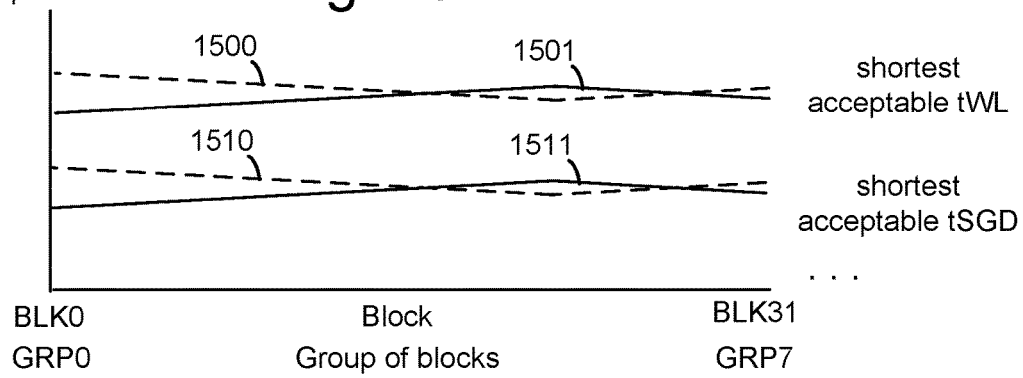
FIG. 15A depicts an example plot of ramping period versus block or group of blocks.
Figure 15B:
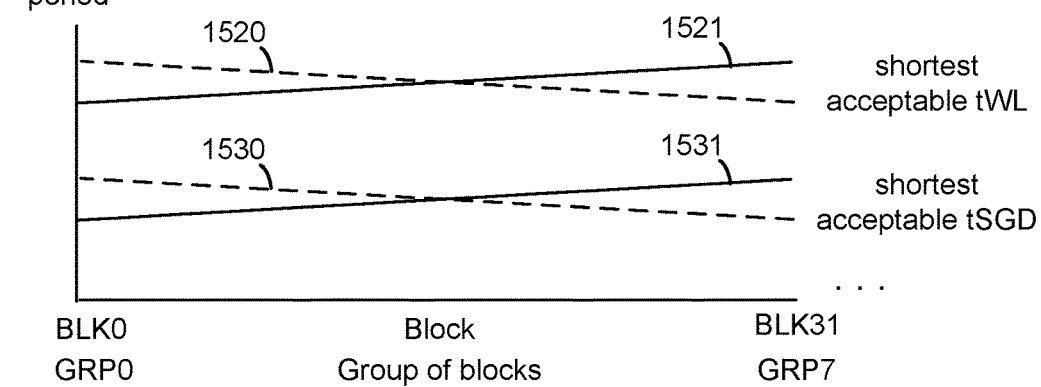
FIG. 15B depicts another example plot of ramping period versus block or group of blocks.

In another approach, such as in FIG. 15A or 15B, the pattern indicates that the shortest value of tSGD is progressively larger for successive selected sub-blocks in the row; and the voltage ramping period is configured to be progressively larger for the successive selected sub-blocks in the row as the shortest value is progressively larger.

FIG. 14B depicts a plot of ramping period versus sets of sub-block for a row of sub-blocks. This example is also consistent with the memory device of FIGS. 10A and 10C. Plot 1411 shows how tSGD alternates between lower and higher values for adjacent sub-blocks in a row, including sub-blocks SB0-SB3 in BLK0 and SB0a-SB3a in BLK1. However, there is also a trend of tSGD increasing along the row. Plot 1410 (dashed lines) shows how tWL corresponds to tSGD. tWL increase with the increasing trend of tSGD. Moreover, a single tWL value is used for a set of sub-blocks in which the word lines are shared. For example, different values are used for sets 1050, 1051, 1052 and 1053 which comprise sub-blocks SB0 and SB1, SB2 and SB3, SB0a and SB1a, and SB2a and SB3a, respectively.

Figure 16:
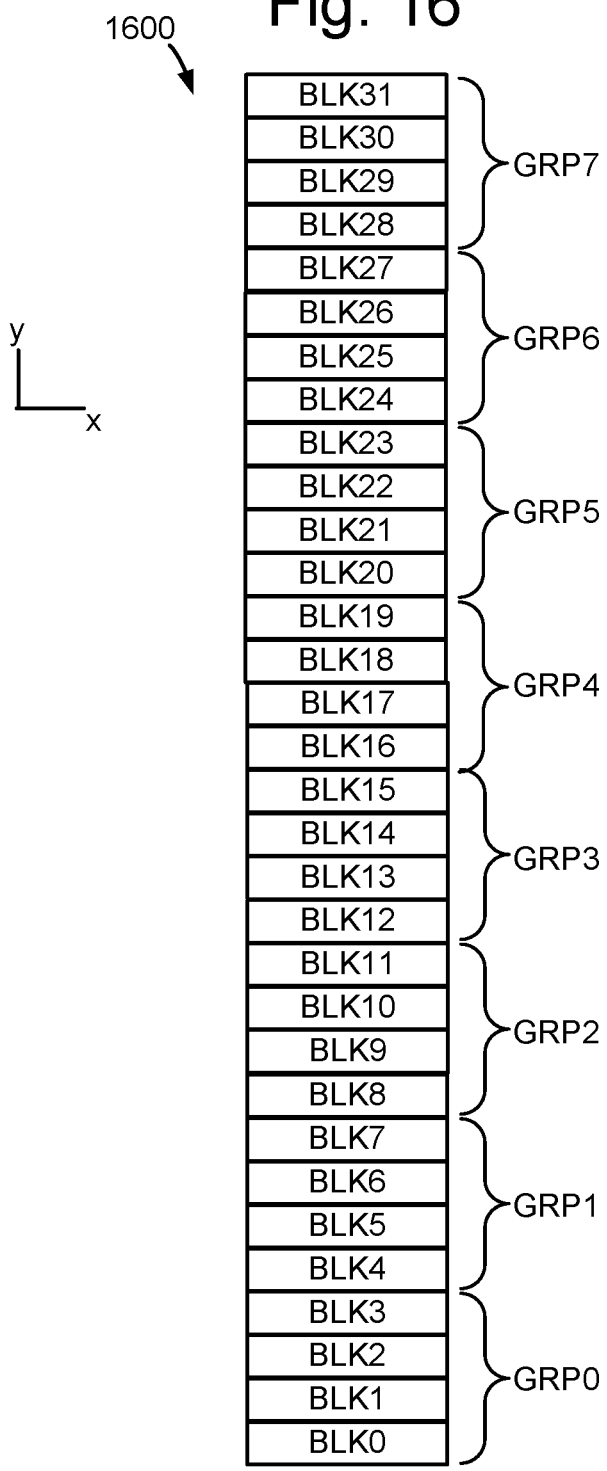
FIG. 16 depicts an example row of blocks arranged in groups.

FIG. 15A depicts an example plot of ramping period versus block or group of blocks. In this example, there are thirty two blocks, BLK0-BLK31, arranged in a row and adjacent to one another, such as in FIG. 16. The blocks may also be assigned to groups GRP0-GRP7, also as depicted in FIG. 16. Plot 1510 shows an example where there is a progressive or gradual decrease and then a progressive increase in the shortest acceptable tSGD in the row of blocks. A corresponding plot 1500 shows there is a progressive decrease and then a progressive increase in the shortest acceptable tWL. Plot 1511 shows an example where there is a progressive decrease and then a progressive increase in the shortest acceptable tSGD in the row of blocks. A corresponding plot 1501 shows there is a progressive increase and then a decrease in the shortest acceptable tWL.

FIG. 15B depicts another example plot of ramping period versus block or group of blocks. Plot 1530 shows an example where there is a progressive and continuous decrease in the shortest acceptable tSGD in the row of blocks. A corresponding plot 1520 shows there is a progressive and continuous decrease in tWL. Plot 1531 shows an example where there is a progressive and continuous increase in the shortest acceptable tSGD in the row of blocks. A corresponding plot 1521 shows there is a progressive and continuous increase in the acceptable tWL.

The trend of the ramping periods is based on the widths of the sub-blocks which can vary in the fabrication process due to various misalignments and other non-uniformities, as mentioned. The techniques described herein do not require actual measurements of the widths, but provide optimum voltage ramping periods which are based on the width and the associated change in resistance and RC (resistance-capacitance) time constant which affects signal propagation time.

By detecting the pattern in the shortest acceptable ramping periods for a set of blocks through the evaluation process of FIG. 12B, for example, the shortest acceptable ramping periods can be set according to the pattern for an adjacent block. For example, when a number of blocks show a pattern of a decreasing shortest acceptable ramping period, the shortest acceptable ramping period for a next adjacent block can be set according to this pattern, e.g., slightly lower. Further, the pattern can be detected over a number of groups of blocks. For example, when a number of groups of blocks show a pattern of a decreasing ramping period, the ramping period for a next adjacent group of blocks can be set according to this pattern, e.g., slightly lower. In one approach, each group has the same number of blocks. For example, in FIG. 16, the thirty two blocks are divided into eight groups of four blocks each. By using a common word line ramping period for the blocks in a group, the amount of overhead data which is stored in the memory device is reduced, compared to using a separate word line ramping period for each block.

In this example, the widths of the conductive layers in a group of the sub-blocks become progressively larger along the row, and the voltage ramping period becomes progressively smaller for the sub-blocks in the group as the widths become progressively larger.

FIG. 16 depicts an example row 1600 of blocks BLK0-BLK31 arranged in groups GRP0-GRP7. Blocks are typically arranged adjacent to one another in a row on a plane on a substrate. In some cases, rows are provided in different planes on the substrate. The misalignments of the blocks can vary as a function of the position of a block, or its sub-blocks or sets of sub-block, in a row. For example, FIG. 14A shows that the misalignment results in alternating lower and higher widths for the sub-blocks along the row. FIG. 14B shows that the misalignment results in alternating lower and higher widths for the sub-blocks along the row but with an increasing trend. FIG. 15A shows that the misalignment results in progressively lower and then higher, or higher and then lower, widths for the sub-blocks and blocks along the row.

FIG. 15B shows that the misalignment results in progressively and continuously lower or higher widths for the sub-blocks and blocks along the row.

FIG. 17A depicts example waveforms of a selected word line in a read operation. In FIG. 17A-17C, the vertical axis depicts voltage and the horizontal axis depicts time. This is an example of a read operation where there are four data states and a lower page of data is read using the read voltages (demarcation voltages) of VrA and VrC, consistent with FIG. 11A. The selected word line voltage, Vwl_sel, ramps up from 0 V to VrA and then from VrA to VrC before ramping back down to 0 V. The solid line plots 1700a, 1710a, 1720a and 1730a represent the case of a sub-block with a relatively large width and therefore relatively low resistance and relatively fast word line ramping time. The dashed line plots 1700b, 1710b, 1720b and 1730b represent the case of a sub-block with a relatively small width and therefore relatively high resistance and relatively slow word line ramping time. The total sensing time of t11-t1 for the case of relatively high resistance is greater than the total sensing time of t10-t1 for the case of relatively low resistance.

For plot 1700a, Vwl_sel ramps up from 0 V to VrA starting at t2. The word line voltage ramping period for the sub-block has been determined to be tp0, e.g., using the process of FIG. 12B, so that the sensing occurs at t4=t2+tp0. The sensing involves detecting a current in the memory string. After sensing at VrA, Vwl_sel ramps up from VrA to VrC starting at t5. The word line voltage ramping period has been determined to be tp0a so that the sensing occurs at t7=t5+tp0a. The word line voltage ramping period can be different for each ramp up of Vwl_sel. For example, if VrC−VrA>VrA−0 V, the ramping period tp0a may be greater than tp0. Or, for a simpler implementation, a common word line voltage ramping period may be used, such that tp0=tp0a. Plot 1700a ramps down starting at t8.

For plot 1700b, Vwl_sel ramps up from 0 V to VrA starting at t3. The ramp up period is longer than for plot 1700a because of the higher word line resistance. The word line voltage ramping period for the sub-block has been determined to be tp1 so that the sensing occurs at t5=t2+tp1. After sensing at VrA, Vwl_sel ramps up from VrA to VrC starting at t6. The word line voltage ramping period has been determined to be tp1a so that the sensing occurs at t9, where t9-t6=tp1a. Plot 1700b ramps down starting at t10.

The word line voltage ramping period and the total time of the read operation is greater when the sub-block has higher resistance. The voltage ramping period occurs in a sensing operation for selected memory cells and comprises a period between (a) a time (t2 or 3; t5 or t6) when the voltage begins to ramp to a demarcation level on the selected word line and (b) a time (t4 or t5; t7 or t9) when a sensing is performed for the selected memory cells relative to the demarcation level.

FIG. 17B depicts example waveforms of an unselected word line in a read operation. Plots 1710a and 1710b are for a sub-block with lower or higher resistance, respectively, and show that the unselected word line voltage, Vwl_unsel, ramps up from 0 V to Vpass starting at t1. Due to the longer sensing time for the sub-block with higher resistance, the ramp down starts at t8 or t10 for a sub-block with lower or higher resistance, respectively. The read operation starts at t1.

FIG. 17C depict example waveforms for SGD transistors in a read operation. Plots 1720a and 1720b are for a selected sub-block with lower or higher resistance, respectively, and show that the SGD control gate voltage, Vsgd, ramps up from 0 V to 3-4 V, for example, starting at t1. Due to the longer sensing time for the sub-block with higher resistance, the ramp down starts at t8 or t10 for a sub-block with lower or higher resistance, respectively. Plot 1720*c* is for an unselected sub-block, where Vsgd can remain at 0 V.

FIG. 17D depicts example waveforms for bit lines connected to selected and unselected memory strings in a read operation. The resistance of the bit lines is not affected by the variations in the sub-block widths. However, the timing of some bit line voltage transitions will change to accommodate changes in other signals, such as Vsgd. Plot 1730*a* depicts Vbl for a selected memory string in a selected sub-block. Vbl ramps up from 0 V to 1-2 V, for example, starting at t1. Due to the longer sensing time for the sub-block with higher resistance, the ramp down starts at t8 or t10 for a sub-block with lower or higher resistance, respectively, as represented by plots 1730*d* and 1730*b*, respectively. Plot 1730*c* is for unselected memory strings in the selected sub-block, where Vbl can remain at 0 V.

A related apparatus comprises: a row of blocks of memory cells on a substrate; means for initiating a sensing operation for memory cells connected to a selected word line in a block of the row of blocks at a first time (e.g., t1), the means for initiating comprises means for applying a demarcation voltage to the selected word line; and means for sensing the memory cells at a second time (t4 or t7; t5 or t9), where the second time is based on a position of the block in the row of blocks. Also, the memory cells may be in a sub-block of the block, and the second time may be based on a position of the sub-block in the block.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 20 including the decoders, voltage drivers, switches and pass transistors. The means can further include any of the control circuits in FIGS. 1 and 2 such as the control circuitry 110 and controller 122.

FIG. 18A depicts example waveforms of selected and unselected word lines in a programming operation. In FIG. 18A-18C, the vertical axis depicts voltage and the horizontal axis depicts time. This is an example of a programming operation which includes a pre-charge phase, a program phase and a verify phase in a program loop such as in FIG. 11B. The pre-charge phase is from t0-t2 or t0-t3 for a low or high resistance sub-block, respectively. In this phase, the SGD transistor of a memory string is made conductive to allow a bit line voltage to change the channel of the memory string. The unselected memory strings are then further charged up in the program phase. The program phase is from t2-t10 or t3-t13 for a low or high resistance sub-block, respectively. In this phase, a program voltage is applied to a selected word line. The program voltage may be ramped up from 0 V to Vpass and then from Vpass to Vpgm. The verify phase or test is from t10-t15 or t13-t18 for a low or high resistance sub-block, respectively. In this phase, one or more verify voltages are applied to the selected word line. The verify voltage may be ramped up from 0 V to VvA and then from VvA to VvB. In this example, the verify phase does not include VvC because it occurs early in the programming operation. See also FIG. 11B.

A plot 1800 indicates that Vwl_sel and Vwl_unsel are initially at 0 V, for example. A plot 1801 represents a ramp up in Vwl_sel and Vwl_unsel for a low resistance block. This ramp up begins when Vsgd reaches 0 V at t2 in FIG. 18B (plot 1822). A plot 1805 represents a second ramp up in Vwl_sel for a low resistance block. This ramp up begins at t6, which is a specified time after Vwl_sel starts to ramp up at t2. Vwl_sel remains at Vpgm for a specified duration, until t9, when it is ramped down (plot 1807) to 0 V. Subsequently, Vwl_sel is ramped up from 0 V to VvA starting at t10 (plot 1809). The word line voltage ramping period is tp2 so that sensing occurs at t12. Vwl_sel is ramped up from VvA to VvB starting at t12*a*. The word line voltage ramping period is tp2*a* so that sensing occurs at t14. Vwl_sel is ramped down from VvB to 0 V at t15 (plot 1811). VvA and VvB are examples of demarcation voltages.

A plot 1802 represents a ramp up in Vwl_sel and Vwl_unsel for a high resistance block. This ramp up begins when Vsgd reaches 0 V at t3 in FIG. 18B (plot 1823). A plot 1806 represents a second ramp up in Vwl_sel for a high resistance block. This ramp up begins at t8, which is a specified time after Vwl_sel starts to ramp up at t3 (plot 1802). Vwl_sel remains at Vpgm for a specified duration, until t11, when it is ramped down (plot 1808) to 0 V. Subsequently, Vwl_sel is ramped up from 0 V to VvA starting at t13 (plot 1810). The word line voltage ramping period is tp2*a* so that sensing occurs at t14. Vwl_sel is ramped up from VvA to VvB starting at t16*a*. The word line voltage ramping period is tp3*a* so that sensing occurs at t17. Vwl_sel is ramped down from VvB to 0 V at t18 (plot 1812).

FIG. 18B depict example waveforms for SGD transistors in a programming operation. As mentioned, the SGD transistors are made conductive during the pre-charge phase. Plots 1820 and 1821 are for a sub-block with lower or higher resistance, respectively, and show that the SGD control gate voltage, Vsgd, ramps up from 0 V to 3-4 V, for example, starting at t0. In this example, Vsgd ramps down at the same time for a sub-block with lower or higher resistance. In another approach, the ramp down occurs later for the sub-block with higher resistance than for the sub-block with lower resistance. Plots 1822 and 1823 are for an unselected sub-block with lower or higher resistance, respectively, and show that Vsgd ramps down to 0 V, for example, starting at t1. As mentioned in connection with FIG. 18A, the time at which Vsgd is expected to reach 0 V or close to 0 V is used to trigger the ramp up of Vwl_sel and Vwl_unsel at t2 or t3 for a sub-block with lower or higher resistance, respectively. As mentioned, the SGD transistor should be non-conductive when Vwl_unsel starts to ramp up so that the channel of the unselected memory strings can be boosted further by capacitive coupling. Vsgd for the unselected sub-blocks remains at 0 V until the end of the programming operation, as shown by plot 1825.

For the selected sub-block in which programming occurs, plot 1824 shows that Vsgd is reduced slightly from its initial level and remains at an elevated level such as 2 V until the end of the programming operation. This allows the SGD transistors of the memory strings to be made conductive when the strings are selected for programming in the current program loop, by setting the corresponding Vbl low, e.g., to 0 V, or non-conductive when the string is not selected for programming in the current program loop, by setting the corresponding Vbl high, e.g., to 2 V. Plots 1826 and 1827 are for a selected sub-block with lower or higher resistance, respectively, and show that Vsgd ramps down to 0 V, for example, starting at t16 or t18, respectively.

In this example, the SGD voltage ramp down period occurs in a program loop and comprises a period between (a) a time (t1) when the voltage begins to ramp down on the select gate line to cause the drain end select gate transistors to begin to transition from a conductive state to a non-conductive state and (b) a time (t2 or t3) when a pass voltage begins to ramp up on the word lines.

FIG. 18C depicts example waveforms for bit lines connected to selected and unselected memory strings in a programming operation. Plot 1830 shows that Vbl ramps up from 0 V to 2 V, for example, starting at t0. Plot 1831 shows that Vbl ramps down from 2 V to 0 V starting at t1 for strings which are selected for programming in the current program loop and remains at 0 V during the programming phase as depicted by plot 1833. Plot 1832 shows that Vbl remains at an elevated level during the programming phase for strings which are not selected for programming in the current program loop.

During the programming phase, the SGD transistor of a selected string (which is in a selected sub-block) will have a high Vsgd as depicted by plot 1824 and a low Vbl as depicted by plot 1833. This provides a high gate-to-drain voltage which makes the SGD transistor conductive. The SGD transistor of an unselected string in a selected sub-block will have a high Vsgd as depicted by plot 1824 (since the Vsgd is common to all strings in a sub-block, in one example) and a high Vbl as depicted by plot 1832. This provides a gate-to-drain voltage which makes the SGD transistor non-conductive. The SGD transistor of (unselected) strings in the unselected sub-blocks will have a low Vsgd as depicted by plot 1825 and a low Vbl as depicted by plot 1833. This provides a gate-to-drain voltage which makes the SGD transistor non-conductive.

After the programming phase, Vbl is set at a level which allows sensing to occur, e.g., 1-2 V, as depicted by plot 1837, for selected memory strings and at a level which does not allow sensing to occur, e.g., 0 V, as depicted by plot 1833a, for unselected memory strings. Vbl may ramp down to either of these levels at t9, in one approach (see plot 1834). After the sensing occurs for a low resistance sub-block at t16, Vbl is ramped down to 0 V (plot 1835) from the level of plot 1837. After the sensing occurs for a high resistance sub-block at t18, Vbl is ramped down to 0 V (plot 1836) from the level of plot 1837.

Figure 18E:
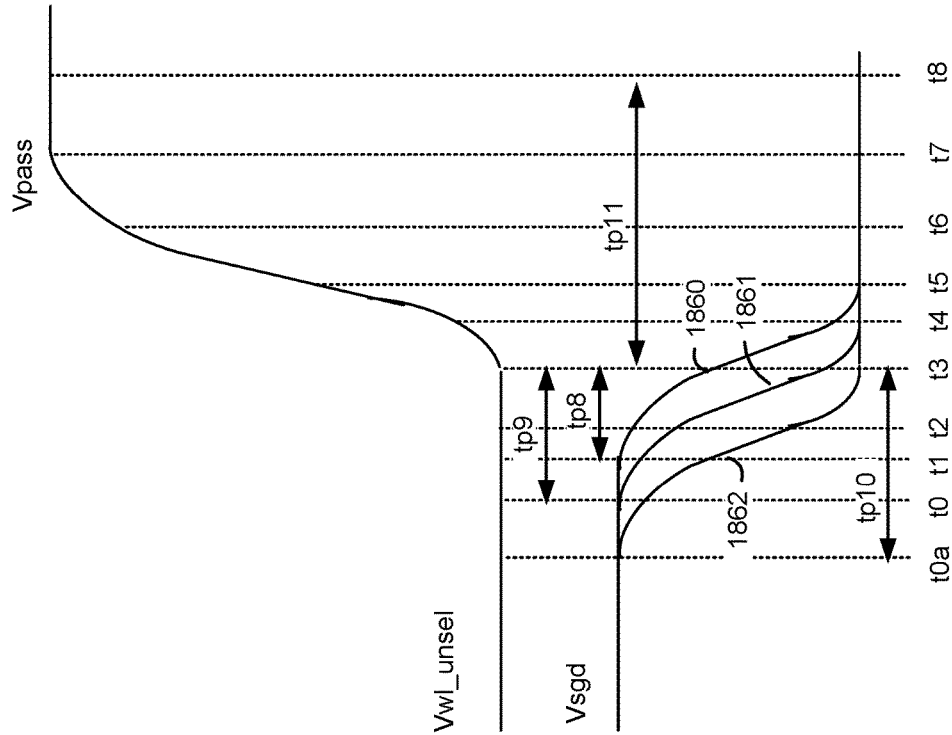
FIG. 18E depicts example waveforms showing different SGD ramp down periods consistent with FIG. 12B, for a SGD layer with a relatively high resistance and a relatively slow ramp down period.
Figure 18D:
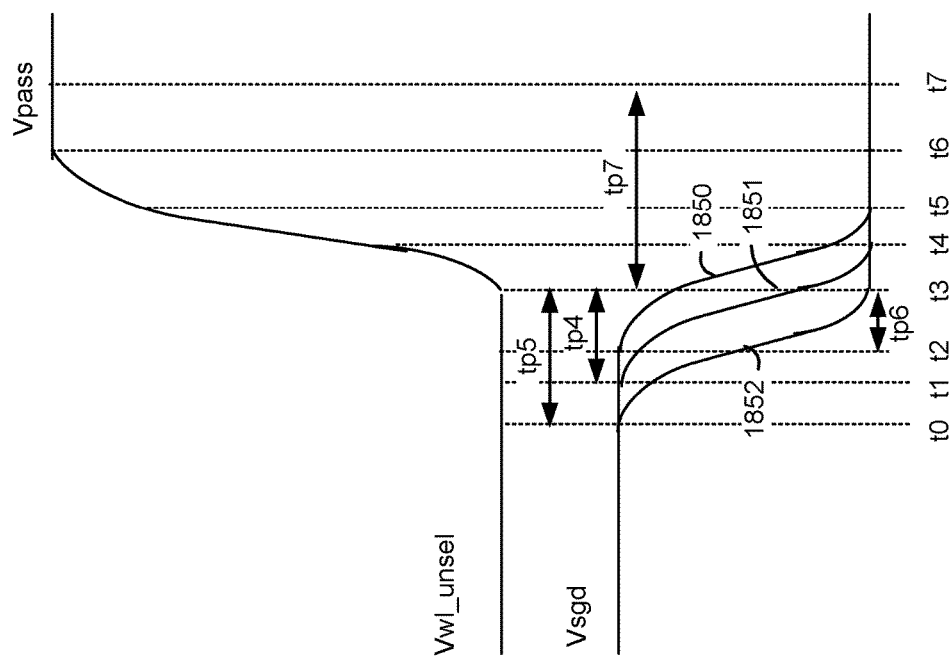
FIG. 18D depicts example waveforms showing different SGD ramp down periods consistent with FIG. 12B, for a SGD layer with a relatively low resistance and a relatively fast ramp down period.

FIG. 18D depicts example waveforms showing different SGD ramp down periods consistent with FIG. 12B, for a SGD layer with a relatively low resistance and a relatively fast ramp down period. As mentioned, tests can be performed in which the SGD ramp down period is changed and the resulting number of read errors is counted. When the number of read errors is acceptable, the corresponding ramp down period is stored as the shortest acceptable SGD ramp down period. In this test, Vwl_unsel starts to ramp up at a specified time t3 and the sensing occurs at a specified time t7=t3+tp7.

Plots 1850, 1851 and 1852 depict a ramp down of Vsgd starting at t2, t1 and t0, respectively, at time periods of tp6, tp5 and tp4, respectively, before the ramp up of Vwl_unsel. Plots 1850 and 1851 extend past t3, when Vwl_unsel starts to ramp up. This is unacceptable because the SGD transistor may be partially conductive so that the channel boosting is reduced (due to leakage of current out of the channel through the SGD transistor and into the bit line). Plot 1852 does not extend past t3, so that the SGD transistor will be non-conductive when Vwl_unsel starts to ramp up. Channel boosting, which prevents program disturb, will therefore be uncompromised. The shortest acceptable SGD ramp down period as in step 1214 of FIG. 12B is therefore tp5=t3−t0.

The different voltage ramp down periods (tSGD) on the select gate line are represented by of tp6, tp5 and tp4. These are the allowed times for the SGD control gate voltage to ramp down from an elevated level to 0 V or nearly 0 V before Vwl_unsel begins to ramp up from 0 V to Vpass. The shortest acceptable tSGD is tp5 in this example. Based on this, the control circuit knows that the SGD control gate voltage should start to ramp down at a time period of tp5 before Vwl_unsel begins to ramp up, for a particular sub-block. Additionally, the corresponding shortest acceptable tWL can be determined. As a result, the elapsed time of a programming or read operation, for instance, can be minimized on a per sub-block basis while avoiding excessive read errors.

FIG. 18E depicts example waveforms showing different SGD ramp down periods consistent with FIG. 12B, for a SGD layer with a relatively high resistance and a relatively slow ramp down period. As before, Vwl_unsel starts to ramp up at t3. However, the sensing occurs later than in FIG. 18D, at a specified time t8=tp3+tp11 and tp11>tp7. Plots 1860, 1861 and 1862 depict a ramp down of Vsgd starting at t1, t0 and t0a, respectively, at time periods of tp8, tp9 and tp10, respectively, before the ramp up of Vwl_unsel. Plots 1860 and 1861 extend past t3, when Vwl_unsel starts to ramp up. Plot 1862 does not extend past t3. The shortest acceptable tSGD as in step 1214 of FIG. 12B is therefore tp10=t3−t0a, which is longer than tp5 in FIG. 18D because of the higher sub-block resistance of FIG. 18E.

Figure 18F:
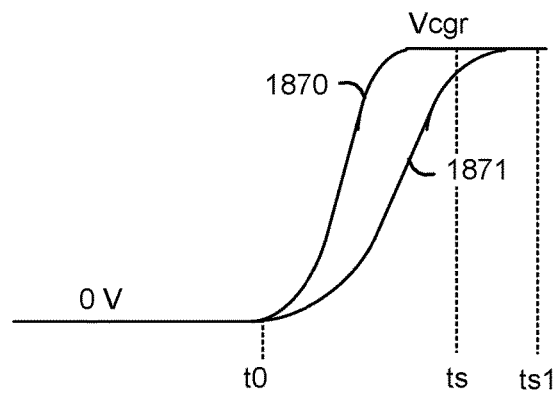
FIG. 18F depicts a word line voltage, showing different ramp up rates.

FIG. 18F depicts a word line voltage, showing different ramp up rates. The vertical direction denotes voltage and the horizontal direction denotes time. A plot 1870 depicts a relatively fast ramp up rate and a plot 1871 depicts a relatively slow ramp up rate. If the sensing time is ts, with the plot 1871, the word line voltage will not reach the desired control gate read level of Vcgr before ts so that the read result will be inaccurate. The sensing time should instead be ts1>ts as depicted. On the other hand, with the plot 1870, the word line voltage reaches the desired level of Vcgr before ts so that the read result will be accurate. The optimum ramp up time for plot 1870 and 1871 is ts-t0 and ts1-t0, respectively.

Figure 19:
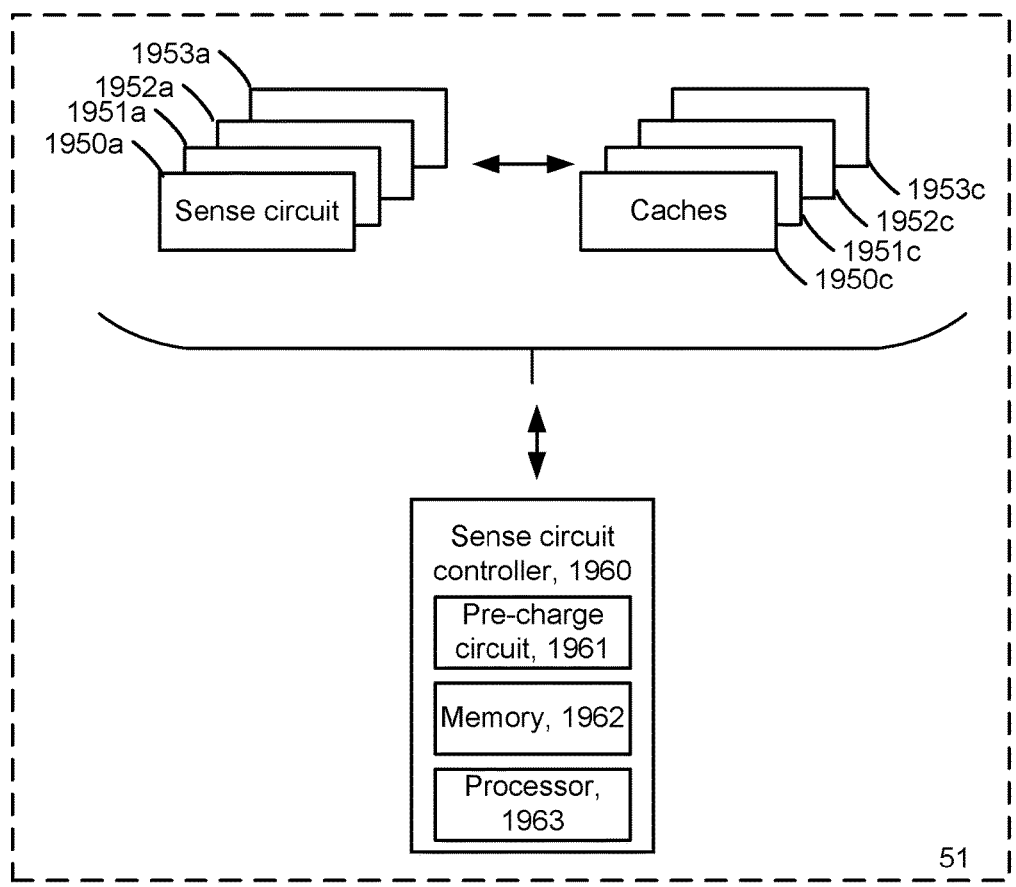
FIG. 19 depicts an example block diagram of a sense block 51 in the column control circuitry of FIG. 1.

FIG. 19 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1950a, 1951a, 1952a and 1953a are associated with caches 1950c, 1951c, 1952c and 1953c, respectively.

In one approach, different subsets of bit lines can be sensed using different respective sense blocks. This allows the processing load which is associated with the sense circuits to be divided up and handled by a respective processor in each sense block. For example, a sense circuit controller 1960 can communicate with the set, e.g., sixteen, of sense circuits and latches. The sense circuit controller may include a pre-charge circuit 1961 which provides a voltage to each sense circuit for setting a pre-charge voltage. The sense circuit controller may also include a memory 1962 and a processor 1963.

Figure 20:
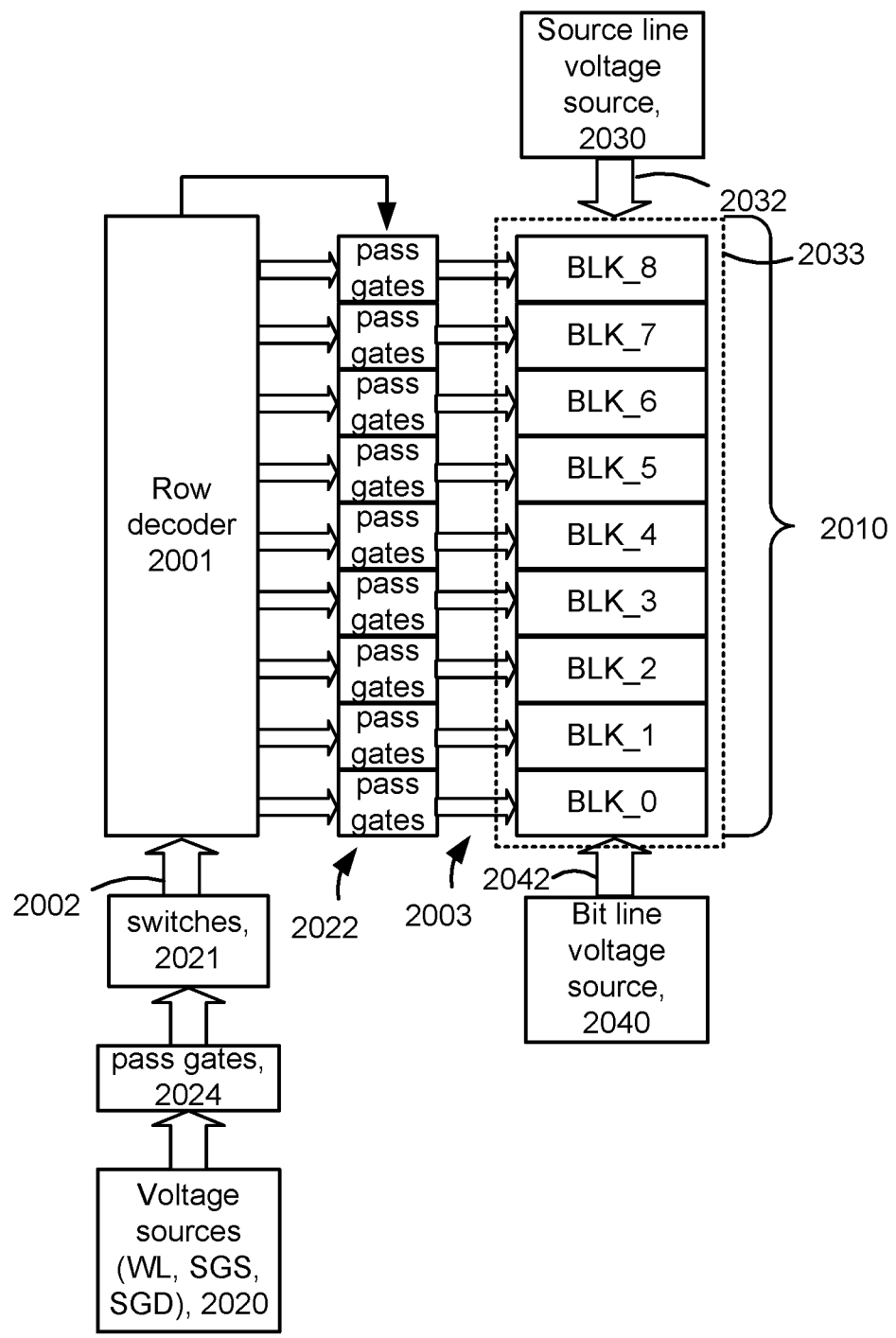
FIG. 20 depicts an example circuit for providing voltages to blocks of memory cells.

FIG. 20 depicts an example circuit for providing voltages to blocks of memory cells. In this example, a row decoder 2001 provides voltages to word lines and select gates of each block in set of blocks 2010. The set could be in a plane and includes blocks BLK0 to BLK8, consistent with FIG. 9B. The row decoder provides a control signal to pass gates 2022 which connect the blocks to the row decoder. Typically, operations, e.g., program, read or erase, are performed on one selected block at a time. The row decoder can connect global control lines 2002 to local control lines 2003. The control lines represent conductive paths. Voltages are provided on the global control lines from voltage sources 2020. The voltage sources may provide voltages to switches 2021 which connect to the global control lines. Pass gates 2024, also referred to as pass transistors or transfer transistors, are controlled to pass voltages from the voltage sources 2020 to the switches 2021.

The voltage sources 2020 can provided voltages on word lines (WL), SGS control gates and SGD control gates, for example.

The various components, including the row decoder, may receive commands from a controller such as the state machine 112 or the controller 122 to perform the functions described herein.

A source line voltage source 2030 provides a voltage to the source lines/diffusion region in the substrate via control lines 2032. In one approach, the source diffusion region 2033 is common to the blocks. A set of bit lines 2042 is also shared by the blocks. A bit line voltage source 2040 provides voltages to the bit lines. In one possible implementation, the voltage sources 2020 are near the bit line voltage source.

In one implementation, an apparatus comprises: a plurality of blocks of memory cells, wherein in each block, the memory cells are arranged in vertical strings in a plurality of sub-blocks, wherein each block comprises conductive layers spaced apart vertically, the conductive layers spaced apart vertically comprise word lines connected to the memory cells, and the plurality of sub-blocks are arranged in a row on a substrate; and a control circuit configured with a voltage ramping period for each sub-block which is a function of a position of the sub-block in the row, wherein the voltage ramping period is for a voltage applied to at least one of the conductive layers.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of blocks of memory cells, wherein in each block, the memory cells are arranged in vertical NAND strings in a plurality of sub-blocks, wherein each block comprises conductive layers spaced apart vertically, the conductive layers spaced apart vertically comprise word lines connected to the memory cells, the plurality of sub-blocks are arranged in a row on a substrate, each sub-block is elongated and has a length in a first direction and a width in a second direction perpendicular to the first direction, and perpendicular to a direction in which the vertical NAND strings extend, the row extends in the second direction, and the widths vary along the row; and
a control circuit configured with a voltage ramping period for each sub-block which is a function of the width of the sub-block, wherein the voltage ramping period is for a voltage applied to at least one of the conductive layers.

2. The apparatus of claim 1, wherein:
each sub-block comprises separate word lines; and
the voltage ramping period is for the separate word lines in each sub-block.

3. The apparatus of claim 1, wherein:
sets of adjacent sub-blocks comprises shared word lines; and
the voltage ramping period is for the shared word lines in each set of adjacent sub-blocks.

4. The apparatus of claim 1, wherein:
the voltage ramping period is for a selected word line connected to selected memory cells; and
the voltage ramping period occurs in a sensing operation for the selected memory cells and comprises a period between (a) a time when the voltage begins to ramp to a demarcation level on the selected word line and (b) a time when sensing is performed for the selected memory cells relative to the demarcation level.

5. The apparatus of claim 1, wherein:
each NAND string comprises a drain end select gate transistor;
in each sub-block, one of the conductive layers comprises a select gate line connected to the drain end select gate transistors; and
the voltage ramping period is for the select gate line.

6. The apparatus of claim 5, wherein:
the voltage ramping period occurs in a program loop and comprises a period between (a) a time when the voltage begins to ramp down on the select gate line to cause the drain end select gate transistors to begin to transition from a conductive state to a non-conductive state and (b) a time when a pass voltage begins to ramp up on the word lines.

7. The apparatus of claim 1, wherein:
the voltage ramping period is a function of a repeating pattern of the widths along the row.

8. The apparatus of claim 1, wherein:
the voltage ramping period is alternatingly relatively larger and relatively smaller along the row when the widths are alternatingly narrower and wider, respectively.

9. The apparatus of claim 1, wherein:
the voltage ramping period increases progressively along the row as the widths decrease progressively across the row.

10. The apparatus of claim 1, wherein:
the voltage ramping period varies with the widths.

11. The apparatus of claim 1, wherein:
the voltage ramping period is progressively greater and then progressively smaller across the row of sub-blocks as the widths are progressively smaller and then progressively greater, respectively, across the row of sub-blocks.

12. The apparatus of claim 1, wherein:
the sub-blocks are separated by isolation areas;
each sub-block comprises a row of the vertical NAND strings extending in the first direction; and
a distance between the row of the vertical NAND strings and an adjacent isolation area varies among the sub-blocks.

13. A method for configuring a memory device, comprising:
performing programming operations for selected sub-blocks of a plurality of sub-blocks of memory cells, wherein the plurality of sub-blocks are arranged in a row on a substrate and widths of the plurality of sub-blocks vary in a direction in which the row extends, the memory cells are arranged in vertical NAND strings, each vertical NAND string comprises a drain end select gate transistor, each sub-block comprises conductive layers spaced apart vertically including word lines connected to the memory cells and a select gate line connected to the drain end select gate transistors, and an allowable voltage ramp down period on the select gate line for unselected sub-blocks of the plurality of sub-blocks before a ramp up of voltages on unselected word lines among the word lines connected to the memory cells is set to be different in each of the programming operations;

for each of the selected sub-blocks, performing a read operation after each programming operation, obtaining a count of a number of read errors, and determining a shortest value of the voltage ramping period for which the count of read errors is below a threshold;

determining a pattern in the shortest value for the selected sub-blocks relative to positions of the selected sub-blocks in the row, wherein the pattern in the shortest value corresponds to a pattern in the widths of the plurality of sub-blocks; and configuring a control circuit for use in a subsequent operation involving another sub-block of the plurality of sub-blocks with a voltage ramping period, wherein the configuring is based on the pattern in the shortest value and a position of the another sub-block in the row.

14. The method of claim 13, wherein:
the subsequent operation comprises a sensing operation for selected memory cells connected to a selected word line in the another sub-block; and
the voltage ramping period comprises a period between (a) a time when a voltage begins to ramp to a demarcation level on the selected word line and (b) a time when sensing is performed for the selected memory cells relative to the demarcation level.

15. The method of claim 13, wherein:
in each unselected sub-block, the allowable voltage ramp down period comprises a period between (a) a time when a voltage begins to ramp down on the select gate line to cause the drain end select gate transistors to begin to transition from a conductive state to a non-conductive state and (b) a time when a pass voltage begins to ramp up on the unselected word lines.

16. The method of claim 13, wherein:
the subsequent operation comprises a programming operation for selected memory cells connected to a selected word line in the another sub-block; and
the voltage ramping period comprises a period between (a) a time when a voltage begins to ramp down on a select gate line in the another sub-block to cause drain end select gate transistors in the another sub-block to begin to transition from a conductive state to a non-conductive state and (b) a time when a pass voltage begins to ramp up on unselected word lines in the another sub-block.

17. The method of claim 13, wherein:
the pattern in the shortest value indicates that the shortest value is alternatingly higher and lower along the row; and
the voltage ramping period is configured to be alternatingly higher and lower along the row.

18. The method of claim 13, wherein:
the pattern in the shortest value indicates that the shortest value is progressively larger along the row; and
the voltage ramping period is configured to be progressively larger along the row.

19. An apparatus, comprising:
a row of sub-blocks of memory cells on a substrate, each sub-block is elongated and has a length in a first direction and a width in a second direction perpendicular to the first direction, and the row extends in the second direction;
means for initiating a sensing operation for memory cells connected to a selected word line in one sub-block of the row at a first time, the means for initiating comprises means for ramping up a voltage of the selected word line to a demarcation voltage; and
means for sensing the memory cells when the voltage of the selected word line settles at the demarcation voltage at a second time, where a time period between the first time and the second time is based on a width of the one sub-block.

20. The apparatus of claim 19, wherein:
the time period is based on a position of the one sub-block in the row.

* * * * *